United States Patent
Huang et al.

(10) Patent No.: US 11,894,410 B2
(45) Date of Patent: Feb. 6, 2024

(54) BOND PAD STRUCTURE FOR BONDING IMPROVEMENT

(71) Applicant: Taiwan Semiconductor Manufacturing Company, Ltd., Hsin-Chu (TW)

(72) Inventors: Sin-Yao Huang, Tainan (TW); Ching-Chun Wang, Tainan (TW); Dun-Nian Yaung, Taipei (TW); Feng-Chi Hung, Chu-Bei (TW); Ming-Tsong Wang, Taipei (TW); Shih Pei Chou, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 83 days.

(21) Appl. No.: 17/590,224

(22) Filed: Feb. 1, 2022

(65) Prior Publication Data
US 2022/0157864 A1 May 19, 2022

Related U.S. Application Data

(60) Continuation of application No. 16/705,376, filed on Dec. 6, 2019, now Pat. No. 11,244,981, which is a
(Continued)

(51) Int. Cl.
*H01L 27/146* (2006.01)
(52) U.S. Cl.
CPC ...... *H01L 27/1464* (2013.01); *H01L 27/1469* (2013.01); *H01L 27/14634* (2013.01); *H01L 27/14636* (2013.01)
(58) Field of Classification Search
CPC .......... H01L 21/76831; H01L 2224/05–05999
See application file for complete search history.

(56) References Cited

U.S. PATENT DOCUMENTS

| 2008/0128848 A1 | 6/2008 | Suzuki et al. |
| 2009/0170233 A1 | 7/2009 | Yun |

(Continued)

FOREIGN PATENT DOCUMENTS

| CN | 101197386 C | 2/2010 |

OTHER PUBLICATIONS

An Aptina Technology White Paper. "An Objective Look at FSI and BSI." May 2010.
(Continued)

*Primary Examiner* — Amar Movva
(74) *Attorney, Agent, or Firm* — Eschweiler & Potashnik, LLC

(57) ABSTRACT

Some embodiments relate an integrated circuit (IC) including a first substrate including a plurality of imaging devices. A second substrate is disposed under the first substrate and includes a plurality of logic devices. A first interconnect structure is disposed between the first substrate and the second substrate and electrically couples imaging devices within the first substrate to one another. A second interconnect structure is disposed between the first interconnect structure and the second substrate, and electrically couples logic devices within the second substrate to one another. A bond pad structure is coupled to a metal layer of the second interconnect structure and extends along inner sidewalls of both the first interconnect structure and the second interconnect structure. An oxide layer extends from above the first substrate to below a plurality of metal layers of the first interconnect structure, and lines inner sidewalls of the bond pad structure.

20 Claims, 22 Drawing Sheets

Related U.S. Application Data continuation of application No. 16/043,919, filed on Jul. 24, 2018, now Pat. No. 10,515,995, which is a division of application No. 15/088,232, filed on Apr. 1, 2016, now Pat. No. 10,038,026.

(60) Provisional application No. 62/184,608, filed on Jun. 25, 2015.

(56) References Cited

U.S. PATENT DOCUMENTS

| | | |
|---|---|---|
| 2011/0024739 A1 | 2/2011 | Shu et al. |
| 2013/0009270 A1 | 1/2013 | Tsai et al. |
| 2013/0057699 A1 | 3/2013 | Ooki |
| 2014/0077060 A1 | 3/2014 | Miyazawa et al. |
| 2014/0151840 A1 | 6/2014 | Cheng |
| 2015/0035109 A1 | 2/2015 | Kataoka |
| 2016/0093661 A1 | 3/2016 | Hu et al. |

OTHER PUBLICATIONS

Non-Final Office Action dated Jul. 28, 2017 for U.S. Appl. No. 15/088,232.
Final Office Action dated Nov. 3, 2017 for U.S. Appl. No. 15/088,232.
Notice of Allowance dated Mar. 21, 2018 for U.S. Appl. No. 15/088,232.
Notice of Allowance dated Oct. 29, 2019 for U.S. Appl. No. 16/043,919.
Non-Final Office Action dated Feb. 17, 2021 for U.S. Appl. No. 16/705,376.
Final Office Action dated Jun. 8, 2021 for U.S. Appl. No. 16/705,376.
Notice of Allowance dated Sep. 24, 2021 for U.S. Appl. No. 16/705,376.

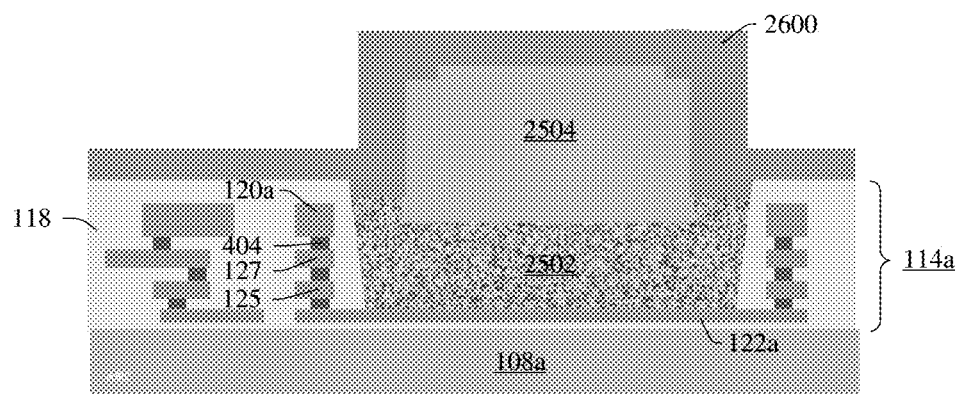
Fig. 26
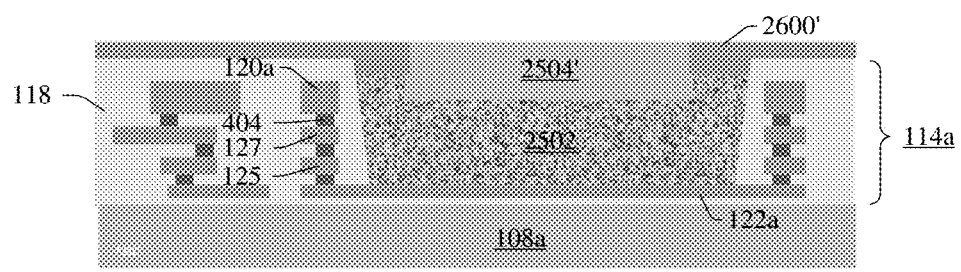
Fig. 27
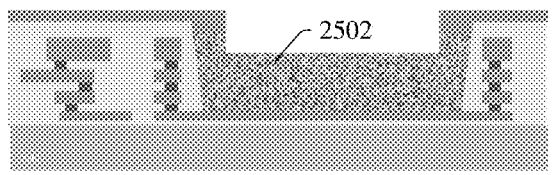 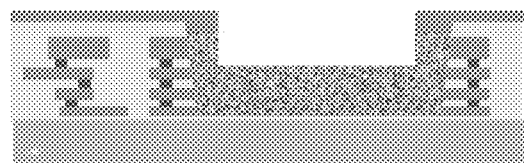
Fig. 28A    Fig. 28B

BOND PAD STRUCTURE FOR BONDING IMPROVEMENT

REFERENCE TO RELATED APPLICATIONS

This Application is a Continuation of U.S. application Ser. No. 16/705,376, filed on Dec. 6, 2019, which is a Continuation of U.S. application Ser. No. 16/043,919, filed on Jul. 24, 2018 (now U.S. Pat. No. 10,515,995, issued on Dec. 24, 2019), which is a Divisional of U.S. application Ser. No. 15/088,232, filed on Apr. 1, 2016 (now U.S. Pat. No. 10,038,026, issued on Jul. 31, 2018), which claims the benefit of U.S. Provisional Application No. 62/184,608, filed on Jun. 25, 2015. The contents of the above-referenced Patent-Applications are hereby incorporated by reference in their entirety.

BACKGROUND

Many modern day electronic devices include optical imaging devices (e.g., digital cameras) that use image sensors. An image sensor may be disposed on an integrated circuit (IC) which includes an array of photodetectors and supporting logic. The photodetectors, which can correspond to individual pixels, measure incident radiation (e.g., light) corresponding to an optical image, and the supporting logic facilitates readout of digital data from the IC. The digital data output from the IC corresponds to a digitally encoded representation of the optical image.

Standard IC manufacturing processes can produce image sensors that use frontside illumination (FSI) techniques or backside illumination (BSI) techniques. With FSI, light falls on a frontside of the IC, and passes through an electrical interconnect structure, such as a stack of back end of line (BEOL) metal layers, before being collected at the photodetectors. Often in FSI, the BEOL metal layers are structured to have openings (apertures) over the individual photodetectors, as the material of the BEOL metal layers can otherwise block light if arranged between the incident light and the photodetectors. To optimize the amount of light that reaches the photodetectors through these apertures; microlenses, waveguides, and other optical features are often used in FSI to minimize reflections and help direct light towards the respective photodetectors.

In BSI, rather than having light pass through openings/apertures in the BEOL metal layers, the sensor is illuminated from the backside (i.e., the face opposite the stack of BEOL metal layers). Compared to FSI, BSI allows a photodetector to have its electrical components on one face of the sensor and its optical path on the other, which allows better separation of optical elements from electrical elements. This means the optical path can be optimized independent of the electrical components and vice versa. The optical constraints for BSI are similar to FSI, except in BSI the photodetectors are often positioned closer to the microlenses, which are now disposed on a thinned down substrate surface. Also, because BSI removes the constraints associated with apertures in the BEOL metal layers, BSI eliminates a loss mechanism for incident light, potentially providing a higher quantum efficiency for the devices.

FSI and BSI technologies are both valuable market segments, with FSI being an established technology that is favorable in lower-cost applications with larger pixels, and BSI being an emerging technology that is favorable in higher-end applications with smaller pixels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 20-28B illustrate a series of cross-sectional views that collectively illustrate an example manufacturing flow consistent with the method of FIG. 19.

DETAILED DESCRIPTION

Figure 1:
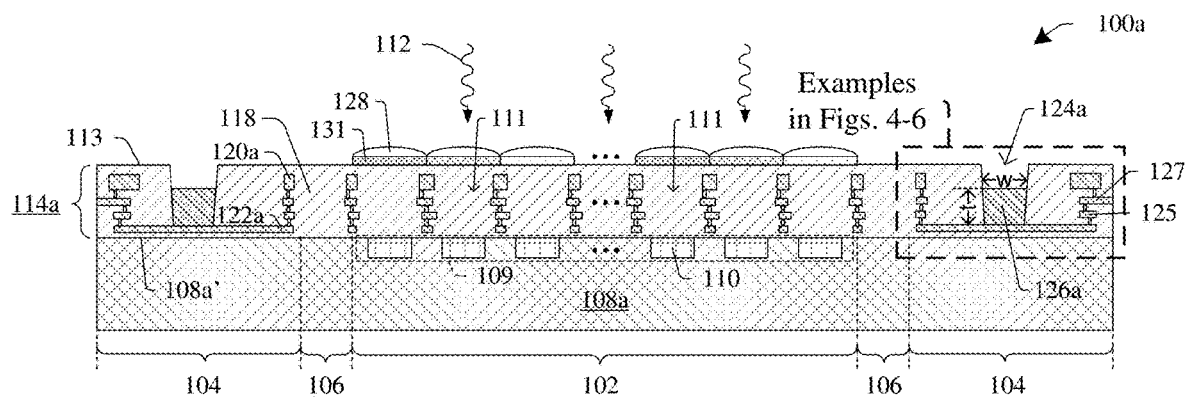
FIG. 1 illustrates a cross-sectional view of some embodiments of an integrated circuit (IC) in the form of a frontside illumination (FSI) sensor having an improved bond pad structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits (ICs), such as BSI ICs and FSI ICs, have bond pad structures by which they are coupled to printed circuit boards, etc. Conventional bond pad structures are less than optimal for a number of reasons. For example, one reason is that the metal of some conventional bond pads is in direct contact with a limited surface area corresponding to a low-κ dielectric of an interconnect structure for the ICs. Because the low-κ dielectric is often a porous material, the bond pads of some conventional BSI ICs and FSI ICs can "peel" back from this porous material due to the poor bonding between the low-κ dielectric and the metal bond pads. If peeling occurs, the resultant IC is often un-usable, leading to wasted resources during the manufacturing process.

Accordingly, the present disclosure relates to improved bond pad structures that are buried further within the interconnect structure of BSI ICs and FSI ICs, providing a larger contact surface area and stronger bonding between the bond pad structures and their underlying surface on the ICs. Thus, these improved bond pad structures resist "peeling" of the metal bond pad from the IC, and help to improve yield and device reliability.

Figure 2:
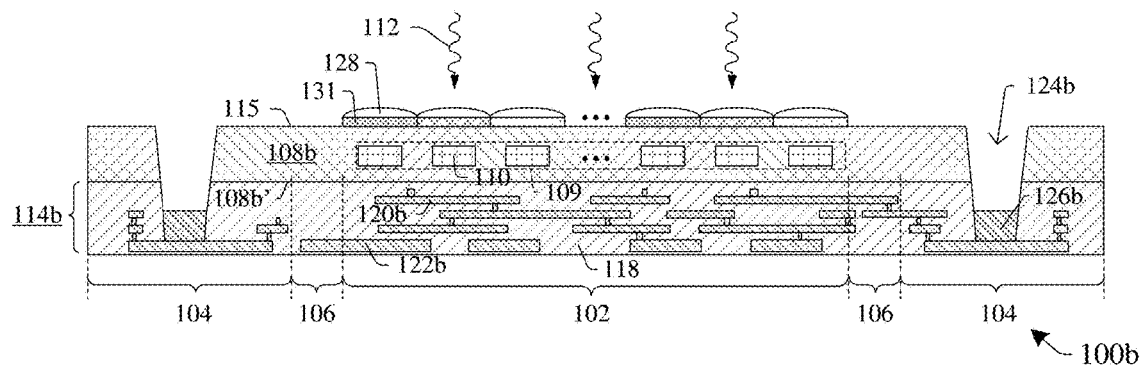
FIG. 2 illustrates a cross-sectional view of some embodiments of an IC in the form of a backside illumination (BSI) having an improved bond pad structure.
Figure 3A:
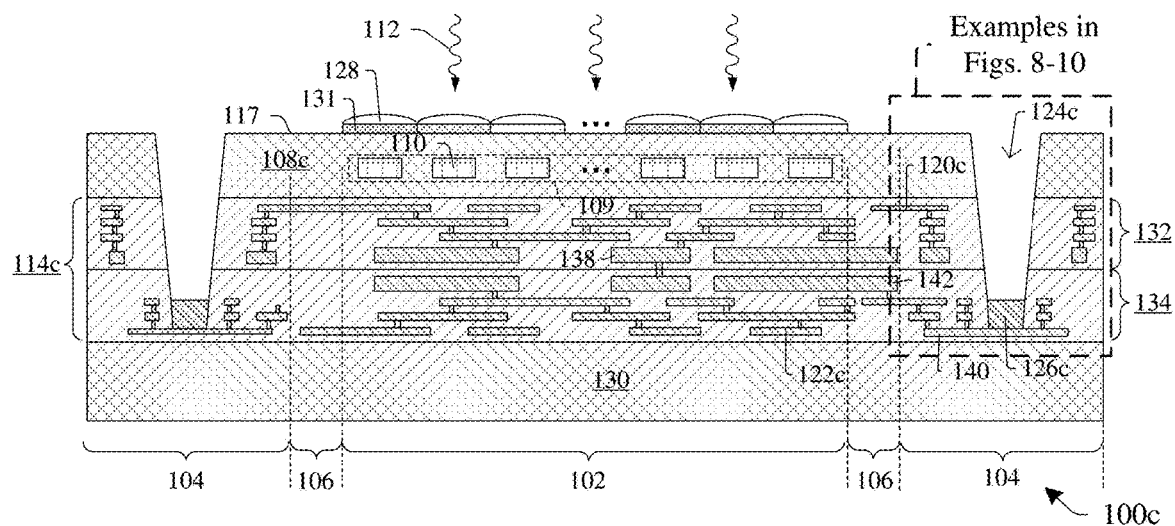
FIG. 3A illustrates a cross-sectional view of other embodiments of a three-dimensional (3D) IC in the form of a backside illumination (BSI) having an improved bond pad structure.

FIGS. 1-3A illustrate some examples of BSI ICs and FSI ICs in accordance with some embodiments of the present disclosure. FIG. 1 provides an example of a frontside illumination (FSI) IC 100*a* sensor in accordance with some embodiments, while FIG. 2 and FIG. 3A provide examples of backside illumination (BSI) ICs 100*b*, 100*c*, respectively in accordance with some embodiments. Each of these ICs (100*a*, 100*b*, 100*c*) includes an image sensor region 102 corresponding to a photosensor array 109 made up of photodetectors 110, and a bond pad region 104 which is laterally spaced from the image sensor region 102. In some embodiments, a logic region 106 is spaced between the image sensor region 102 and the bond pad region 104. If present, the logic region 106 can include logic devices (not shown) configured to support operation of one or more photodetectors 110 in the image sensor region 102.

Referring briefly to FIGS. 1-3A concurrently, each IC (100*a*, 100*b*, 110*c*) includes a first substrate (108*a*, 108*b*, 108*c*, respectively) with an interconnect structure (114*a*, 114*b*, 114*c*, respectively) there over. Each interconnect structure includes a plurality of metal layers and insulating layers that are over stacked over one another in alternating fashion. One of the plurality of metal layers (120*a*, 120*b*, 120*c*, respectively) is closest to a light source from which incident light 112 approaches the 3DICs (100*a*, 100*b*, 100*c*, respectively), and another of the plurality of metal layers (122*a*, 122*b*, 122*c*, respectively) is furthest from the light source. A bond pad recess (124*a*, 124*b*, 124*c*, respectively) extends through the interconnect structure and terminates at a bond pad (126*a*, 126*b*, 126*c*, respectively). The bond pad is in direct contact with the metal layer further from the light source (122*a*, 122*b*, 122*c*, respectively). The bond pads (126*a*, 126*b*, 126*c*, respectively) being 'buried' into the interconnect structure (114*a*, 114*b*, 114*c*, respectively) in this manner rather than just being bonded to the metal layer closest to the light source helps to provide strong bonding for the bond pads, which reduces the likelihood of the bond pads peeling back from the 3DICs 102*a*, 102*b*, 102*c*.

In some embodiments, the bond pads and the metal layers are made of copper, aluminum, or an aluminum copper compound, and the insulating layers between neighboring metal layers are made of a low-κ dielectric material. A bond pad can have a size that is sufficient to allow bonding of the bond pad to another structure, such as a printed circuit board. For example, in FIG. 1's embodiment, bond pad 126*a* can have a thickness, t, ranging from about 500 angstroms to about 3000 angstroms, being about 1400 angstroms in some embodiments; and can have an exposed surface area ranging from about 10 square microns to about 30 square microns, being about 18 square microns in some embodiments. In some embodiments, other bond pads can have these same dimensions, but embodiments described and illustrated herein are not limited to these dimensions.

In FIG. 1's IC 100*a*, which is an example of a FSI sensor, the interconnect structure 114*a* is arranged between the light source and the first substrate 108*a*. Thus, incident light 112 passes through apertures 111 within interconnect structure 114*a* before being received by a photodetector 110 (i.e., light passes through frontside 113 of the IC 100*a*). Thus, the interconnect structure 114*a* comprises a lowermost metal layer 122*a* spaced at a first distance from a first substrate surface 108*a*', an uppermost metal layer 120*a* spaced at a second distance from the first substrate surface 108*a*'. The second distance is greater than the first distance. For example, the lowermost metal layer 122*a* can be a metal 1 layer, and the uppermost metal layer 120*a* can be a top metal layer (e.g., metal 8 metal layer) which has a thickness that is greater than a thickness of the lowermost layer to provide lower resistance. Microlenses 128 can help direct the incident light downward through the apertures 111 to the individual photodetectors 110, and color filters 131 corresponding to different wavelengths of light can filter the incident light 112 to enable the photodetectors 110 (which are naturally colorblind in some implementations) to distinguish between different colors of incident light.

As shown, in FIG. 1's embodiment, the bond pad recess 124*a* extends downwardly from an interconnect structure upper surface 113 and past the uppermost metal layer 120*a*. The bond pad 126*a* is disposed in this bond pad recess 124*a* to be in direct contact with the lowermost metal layer 122*a*. The bond pad 126*a* being 'buried' in the interconnect structure 114*a* rather than just being bonded to a top surface of the uppermost layer 120 helps to provide strong bonding for the bond pad 126*a*, which reduces the likelihood of the bond pad 126*a* peeling back from the IC 100*a*.

FIG. 2's IC 100*b*, which is an example of a BSI sensor, the first substrate 108*b* is arranged between the light source and the interconnect structure 114*b*, such that the incident light 112 is received by the photodetector 110 without previously passing through the interconnect structure 114*b* (i.e., light passes through backside 115 of the IC 100*b*). The interconnect structure 114*b* includes a lowermost metal layer 120*b* spaced at a first distance from a first substrate surface 108b', and an uppermost metal layer 122b spaced at a second distance from the first substrate surface 108b'. The second distance is greater than the first distance. The bond pad recess 124b extends upwardly through the first substrate 108b, into the interconnect structure 114b, and past the lowermost metal layer 120b. The bond pad 126b is in direct contact with the uppermost metal layer 122b. The bond pad 126b being 'buried' into the interconnect structure 114b rather than just being bonded to a bottom surface of the lowermost metal layer 120b helps to provide strong bonding for the bond pad 126b, which reduces the likelihood of the bond pad 126b peeling back from the IC 100b.

FIG. 3A's IC 100c, which is another example of a BSI sensor, has first substrate 108c arranged between the light source and interconnect structure 114c, such that the incident light 112 is received by the photodetector 110 without previously passing through interconnect structure 114c (i.e., light passes through a backside 117 of the IC 100c). FIG. 3A's IC 100c also includes a second substrate 130 disposed over the first substrate 108c, wherein interconnect structure 114c is arranged between the first and second substrates 108c, 130. Because FIG. 3A's IC 100c includes a plurality of logic devices, such as complementary metal multiple substrates that are stacked and bonded over one another, IC 100c may be referred to as a "three-dimensional IC". The second substrate 130 includes a plurality of complementary metal oxide semiconductor (CMOS) devices, which can be operably coupled to the photodetector 110 through the interconnect structure 114c. Interconnect structure 114c includes a first interconnect structure 132 coupled to the photodetector 110, and a second interconnect structure 134 coupled to the logic devices on the second substrate 130. The first interconnect structure 132 includes a first lowermost metal layer 120c spaced at a first distance from a first surface of the first substrate 108c; and a first uppermost metal layer 138 spaced at a second distance from the first surface of the first substrate, the second distance being greater than the first distance. The second interconnect structure 134 includes a second lowermost metal layer 122c spaced at a third distance from a first surface of the second substrate 130; and a second uppermost metal layer 142 spaced at a fourth distance from the first surface of the second substrate 130, the fourth distance being greater than the third distance. The uppermost metal layers 138, 142 can be thicker than the corresponding lowermost metal layers 120c, 122c to reduce resistance of the uppermost metal layers. The second uppermost metal layer 142 is nearer to the first uppermost metal layer 138 than to the first lowermost metal layer 120c. The bond pad recess 124c extends upwardly through the first substrate 108c, through the first interconnect structure 132, and past the second uppermost metal layer 142, and terminates at bond pad 126c. The bond pad 126c is in direct contact with the second lowermost metal layer 122c. Again, the bond pad 126c being 'buried' into the interconnect structure 114c rather than just being bonded to a bottom surface of the lowermost layer 122c helps to provide strong bonding for the bond pad 126c, which reduces the likelihood of the bond pad 126c peeling back from the 3DIC 100c.

Although bond pads 126a-126c are illustrated in FIGS. 1-3A as being in direct contact with the metal layer furthest from incident light 112, it is also advantageous in some embodiments for the bond pads to be in direct contact with other intervening metal layers in the interconnect structures 114a-114c. For example, with regards to FIG. 1, in some alternative embodiments the bond pad 126a is not coupled directly to the lowermost metal layer 122a, but rather is coupled to the second metal layer 125 (which is second furthest from the incoming light). The bond pad 126a could alternatively be in direct contact with the third metal layer 127. Because the bond pad 126a is still 'buried' somewhat in the interconnect structure 114a in these alternative embodiments, these embodiments can still provide some improved resistance to "peeling" compared to conventional approaches. Similar modifications can be made to FIGS. 2 and 3A, whereby the bond pads 126b and 126c can be in direct contact with intervening metal layers in interconnect structures 114b, 114c.

Further, although FIGS. 1-3A illustrate bond pads in the context of FSI and BSI ICs, devices in which a bond pad region 104 is disposed laterally about an image sensor region 102; it will be appreciated that although the present bond pad concept find utility in FSI and BSI ICs, these bond pad concepts are generally applicable to any type of IC. Thus, FIG. 3B illustrates an example of a 3DIC 300, which is made up of first and second substrates 302, 304, which are bonded together at an interconnect structure 306. Additional substrates (not shown) and/or additional interconnect structures may also be included. Thus, compared to FIGS. 1-3A, where bond pad region 104 surrounds image sensor region 102, FIG. 3B shows an example where bond pad region 308 surrounds an IC region 310. The IC region 310 is not limited to photodetectors, but can correspond to any type of IC region, such as a logic region, MEMS device region, CMOS device region, capacitor region, biosensor region, memory region, test structure region, or BiCMOS region, for example. In such embodiments, a bond pad structure can include a bond pad recess 312 that terminates at a bond pad 314 which is in direct contact with a metal layer buried into the interconnect structure 306.

Figure 3B:
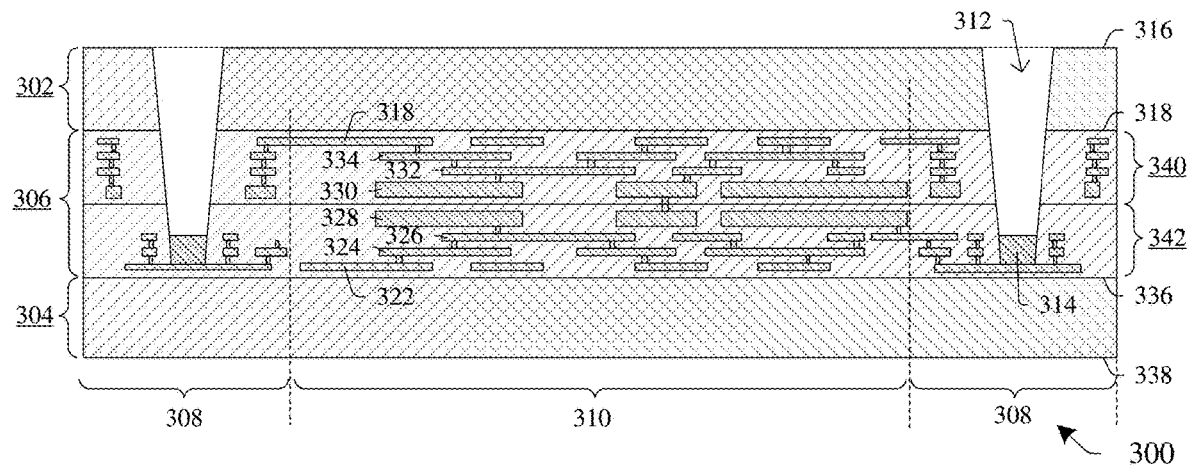
FIG. 3B illustrates a cross-sectional view of other embodiments of a 3DIC in accordance with some embodiments.

In FIG. 3B's example, the first substrate 302 has a first surface 316 and a second surface 318. The interconnect structure 306 is arranged over the first substrate 302, and includes a plurality of metal layers and insulating layers that are over stacked over one another in alternating fashion. A lower metal layer 320 is closest to the second surface 318, an upper metal layer 322 is furthest from the second surface 318, and intermediate metal layers (e.g., 324, 326, 328, 330, 332, 334) are disposed between the upper and lower metal layers. The second substrate 304 is disposed over the 306 interconnect structure. The second substrate 304 has a third surface 336 over the interconnect structure 306 and a fourth surface 338 over the third surface 336. The bond pad recess 312 extends into the interconnect structure 306 from an opening in the first surface 316 and terminates at the bond pad 314. The bond pad 314 is in direct contact with the upper metal layer 322 or one or more of the intermediate metal layers (e.g., 324, 326, 328, 330, 332, 334).

The interconnect structure 306 can include first and second interconnect structures 340, 342 stacked over one another. The first interconnect structure 340 is disposed over the first substrate 302 and is coupled to semiconductor devices in the first substrate. The first interconnect structure 340 includes a first subset of the plurality of metal layers of the interconnect structure 306. A first lower metal layer 320 of the first interconnect structure 340 is closest to the second surface 318, a first upper metal layer 330 of the first interconnect structure 340 is furthest from the second surface 318, and first intermediate metal layers 332, 334 are disposed between the first lower and upper metal layers 320, 330. The second interconnect structure 342 is disposed over the first interconnect structure 340 and is coupled to semiconductor devices of the second substrate 304. The second interconnect structure 342 includes a second subset of the plurality of metal layers of the interconnect structure 306, wherein the second subset is non-overlapping with the first subset. A second lower metal layer 322 of the second interconnect structure 342 is closest to the third surface 336, a second upper metal layer 328 of the second interconnect structure 342 is furthest from the third surface 336, and second intermediate metal layers 326, 328 are disposed between the second lower and upper metal layers 322, 328. The first and second upper metal layers 330, 328 can be thicker than the first and second lower metal layers 320, 322, respectively. In some embodiments, the bond pad 314 is in direct contact with the second upper metal layer 328, the second lower metal layer 322, or one or more of the second intermediate metal layers 326, 328. In other embodiments, the bond pad 314 is in direct contact with the first upper metal layer 330 or one or more of the first intermediate metal layers 332, 334.

Figure 3C:
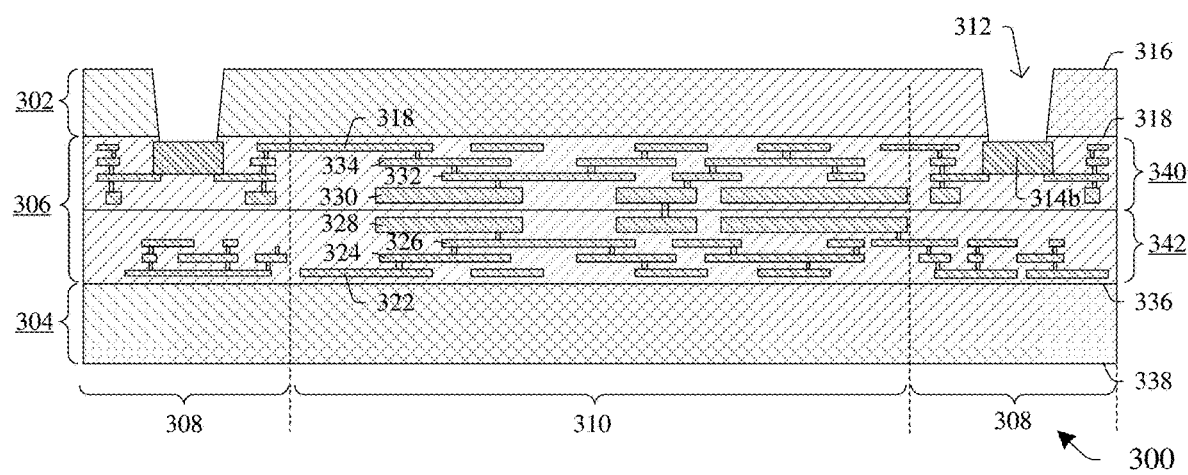
FIG. 3C illustrates a cross-sectional view of other embodiments of a 3DIC in accordance with some embodiments.

FIG. 3C illustrates another example where the bond pad 314b is in direct contact with intermediate metal layer 332 in first interconnect structure 314 as another example.

Figure 4:
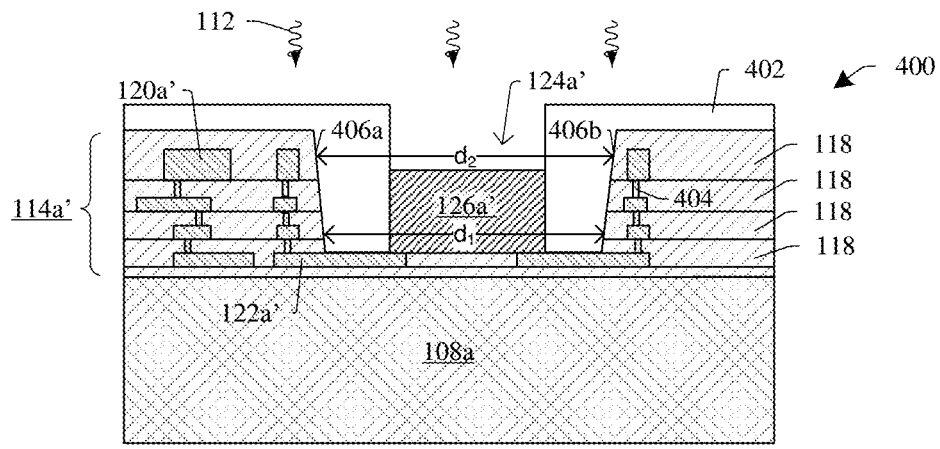
FIGS. 4-6 illustrate a few more detailed examples of FSI bond pad regions, such as can be included in the 3DIC of FIG. 1.
Figure 5:
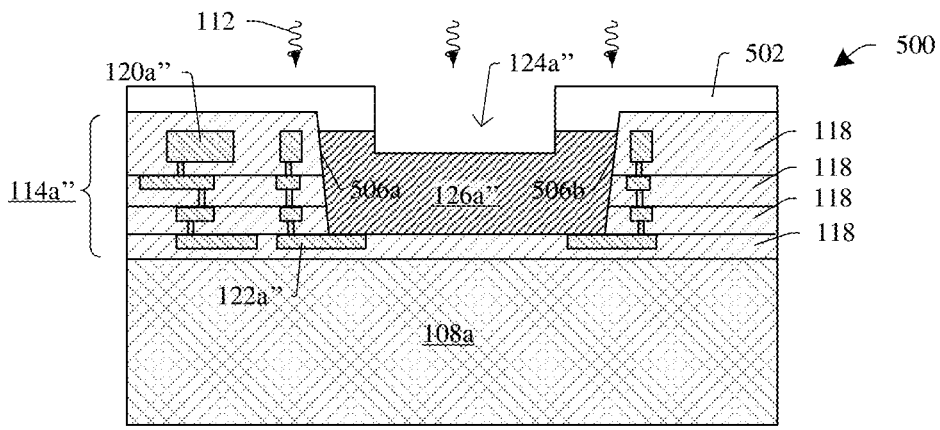
Figure 6:
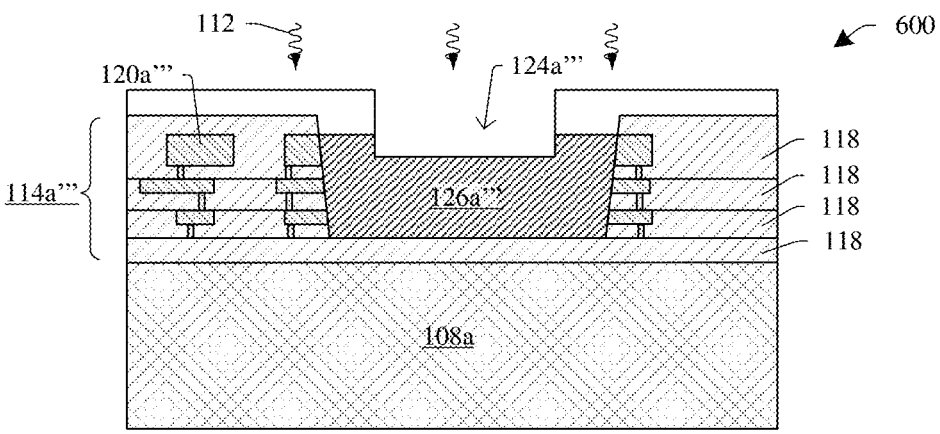

Several more detailed examples are now provided in the context of FSI and BSI ICs. FIGS. 4-6 illustrate a few more detailed examples of FSI bond pad regions, such as can be included in 3DIC of FIG. 1.

In FIG. 4's bond pad region 400, which is an example of a bond pad region of an FSI sensor, the interconnect structure 114a' is arranged between the light source and the first substrate 108a, which may also be referred to as an imaging substrate in some embodiments. The interconnect structure 114a' comprises a lowermost metal layer 122a' (e.g., a metal 1 layer) spaced at a first distance from a first surface of the first substrate 108a, an uppermost metal layer 120a' (e.g., metal 8 layer) spaced at a second distance from the first surface of the first substrate (108a). The second distance is greater than the first distance. The thickness of the uppermost metal layer 120a' can be greater than a thickness of the lowermost metal layer 122a' to provide lower resistance. Interlayer dielectric (ILD) layers 118 separate metal layers from one another. Vias 404 electrically couple the metal layers to one another, and contacts (not shown) electrically couple the lowermost metal layer 122a to photodetectors 110 and or other devices on first substrate 108a. The metal layers 120a', 122a'; vias 404; and/or contacts may be made of a conductive material, such as aluminum copper, or tungsten, or some other metal or conductive material. The ILD layers 118 may be, for example, a low-κ dielectric material.

Bond pad recess 124a' extends downwardly from an upper surface of the interconnect structure 114a and past the uppermost metal layer 120a'. The illustrated bond pad recess 124a' has sidewalls 404a, 406b that are angled, whereby lower sidewalls are spaced apart by a first distance, d1, near the lowermost metal layer 122a'. The sidewalls 406a, 406b become further spaced at upper sidewall where they are separated by a second distance, d2, which that is greater than the first distance, d1. A sidewall liner 402, which is made of a dielectric material such as an oxide for example, covers the angled sidewalls 406a, 406b and extends over the upper surface of the interconnect structure. The sidewall liner 402 has vertical or substantially vertical inner sidewalls which abut outer sidewalls of bond pad 126a'. A lower surface of the bond pad 126a' is in direct physical and electrical contact with the lowermost metal layer 122a'. The upper and lower surfaces of the bond pad 126a' can be planar or substantially planar in some embodiments.

In FIG. 5's bond pad region 500, the FSI bond pad structure includes a bond pad recess 124a" with angled sidewalls 506a, 506b. The bond pad 126a" is disposed in this bond pad recess 124a" to have a lower surface in direct contact with the lowermost metal layer 122a". The bond pad 126a" also has outer sidewalls that directly abuts the angled sidewalls 506a, 506b of the bond pad recess 124a" and ILD layer 118. A dielectric liner 502, which can be made of oxide for example, is disposed over the bond pad 126a" and upper surface of the interconnect structure 114a". A central portion of bond pad 126a" is recessed, such that protruding edge regions of the bond pad extend upwardly from a base portion of the bond pad; and inner sidewalls of the dielectric liner 502 and inner sidewalls of the bond pad 126a" are aligned.

In FIG. 6, another example of a BSI structure in accordance with some embodiments is provided. In FIG.'s BSI structure, the bond pad has sidewalls that are in direct electrical contact with corresponding sidewalls of the metal layers, rather than being in contact with an upper or lower surface of the metal layers. This coupling can also help to provide greater bondability between the bond pad and the IC, and help resist peeling.

Figure 7:
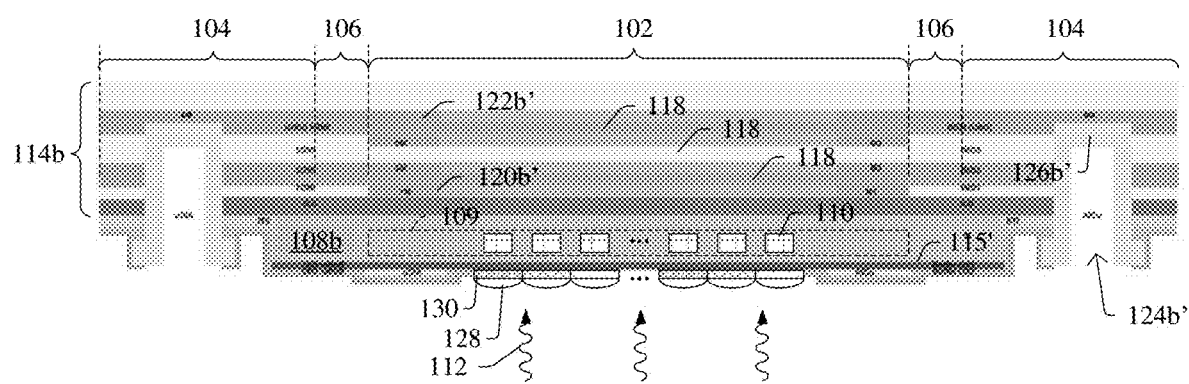
FIG. 7 illustrates a more detailed example of a 3DIC that includes a BSI sensor in accordance with some embodiments of FIG. 2.

In FIG. 7, a more detailed example of a FSI bond pad region, such as can be included in 3DIC of FIG. 2, is illustrated. In FIG. 7's example, the bond pad has a u-shaped cross-section where vertical projections extend upwardly from a base portion of the bond pad. The bond pad is disposed on an edge region of the 3DIC where the substrate has been removed.

Figure 8:
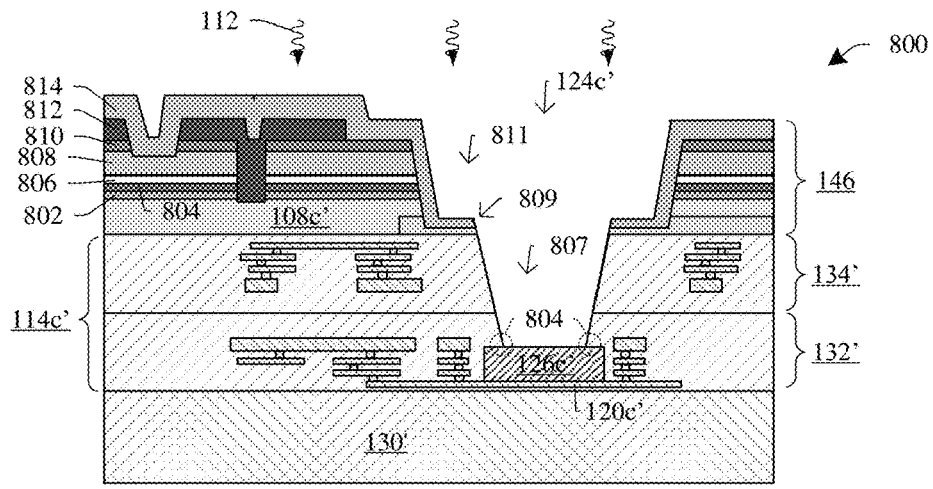
FIGS. 8-10 illustrate a few more detailed examples of BSI bond pad regions, such as can be included in 3DIC of FIG. 3A.
Figure 9:
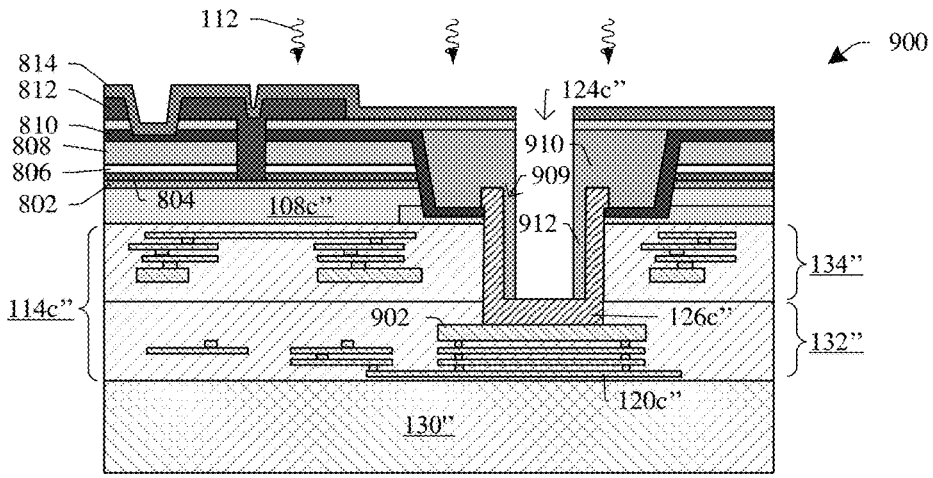
Figure 10:
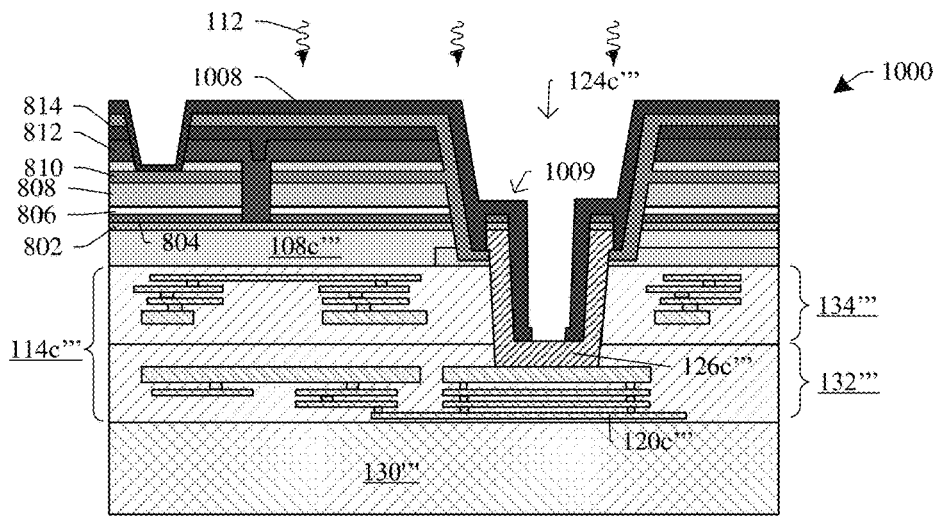

FIGS. 8-10 illustrate a few more detailed examples of FSI bond pad regions, such as can be included in 3DIC 100c of FIG. 3A.

In FIG. 8, a BSI bond pad region 800 includes a first substrate 108c', which may also be referred to as an imaging substrate, and a second substrate 130' which may also be referred to as a CMOS substrate in some embodiments. An interconnect structure 114c' includes a first interconnect structure 132', which may be referred to as an image sensor interconnect structure in some embodiments, and a second interconnect structure 134', which may be referred to as a CMOS interconnect structure in some embodiments. The interconnect structure 114c' is disposed between the imaging substrate 108c' and CMOS substrate 130'. A bond pad recess 124c' extends through the imaging substrate 108c', through the imaging interconnect structure 134', and into the CMOS interconnect structure 132', and terminates at bond pad 126c'. The bond pad 126c' is in direct physical and electrical contact with a lowermost metal layer 120c' of the imaging interconnect structure, which is nearest the CMOS substrate 130'. A multi-layer passivation structure 146 can extend over the imaging substrate 108c', and can include a Slot-Plane-Antenna (SPA) radical oxide layer 802, a HfO2 layer 804, a Ta2O5 layer 806, a plasma enhanced oxide layer (PEOx) 808, a silicon nitride (SiN) layer 810, a blocking layer (e.g., Ti, TiN, or W) 812, and an oxide layer 814.

The bond pad recess 124c' has angled sidewalls 804a, 804b. A lower portion of bond pad recess 807 generally has a first width, while the bond pad recess widens at a shoulder region 809 so an upper portion of the bond pad recess 811 has a second width which is greater than the first width. Upper sidewall portions cover outer edge regions (804) of the bond pad adjacent to the bond pad recess. Oxide liner 814 extends downwardly along sidewalls of the upper portion of the bond pad recess 810. Because the outer edges of bond pad 126c' are covered by sidewalls of CMOS interconnect structure 132', the oxide layer 910 can help to reduce "peeling" of the bond pad compared to some other approaches.

FIG. 9 shows another embodiment of a bond pad region 900 for a BSI sensor. In this example, the bond pad 126c'"

is u-shaped in cross-section and extends conformally along inner sidewalls of second interconnect 134" and directly abuts uppermost metal layer 902 of first interconnect structure 132'. Thus, compared to previous illustrated examples where bond pads were in direct contact with a metal layer furthest from the incident light 112 (e.g., lowermost metal layer 120c"), FIG. 9 illustrates an example of a bond pad 126c" in direct contact with an intermediate metal layer (e.g., uppermost metal layer 902) in interconnect structure 114c". An uppermost portion of the bond pad 126" protrudes upwardly beyond shoulder region 909 into the upper portion of the bond pad recess 124". A conformal oxide layer 810 is disposed over the sidewalls of recess, and another oxide layer 910 is disposed over the conformal oxide layer 810. The oxide layer 910 can have lower portions 912 extending downwardly to cover inner sidewalls of the bond pad 126". In FIG. 9's example the bond pad 126" has vertical or substantially vertical sidewalls, and a base region with planar or substantially planar upper and lower surfaces. Because it is disposed over edges of the bond pad 126'", the oxide layer 910 can help to reduce "peeling" of the bond pad compared to some other approaches.

FIG. 10 shows another embodiment of another bond pad region 1000 for a BSI sensor. In this example, the bond pad 126'" is v-shaped in cross-section and extends conformally along inner sidewalls of second interconnect 134'" and directly abuts uppermost metal layer of first interconnect structure 132'". An uppermost portion of the bond pad 126'" protrudes upwardly beyond the shoulder region 1009 into the upper portion of the bond pad recess 124c'". An oxide layer 1008 is disposed over the bond pad 126" and can in some cases cover inner sidewalls of the bond pad. Because it is disposed over edges of the bond pad 126'", the oxide layer 1008 can help to reduce "peeling" of the bond pad 126'" compared to some other approaches.

Figure 11:
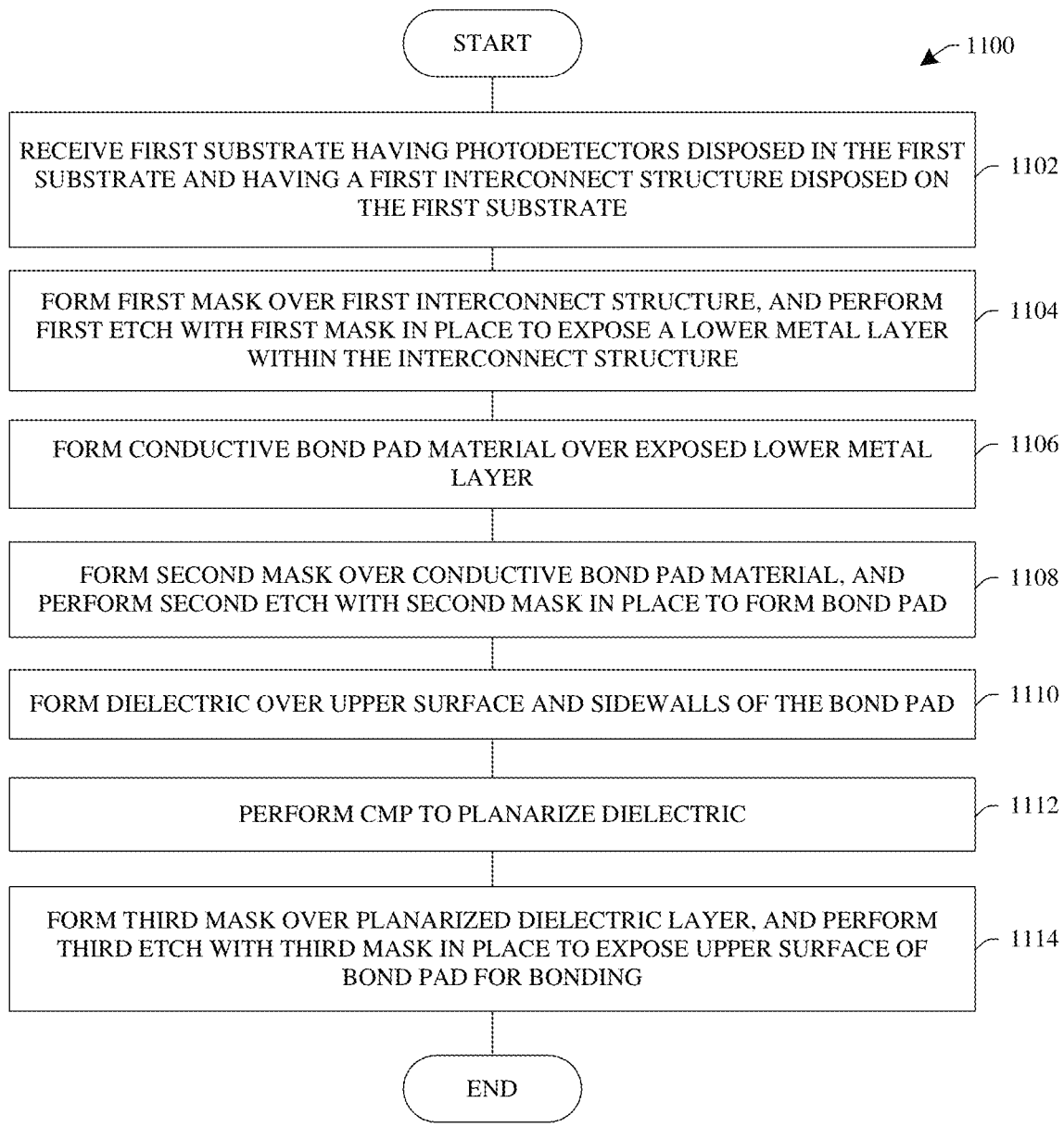
FIG. 11 illustrates a flowchart of some embodiments of a method for manufacturing a 3DIC having a FSI sensor with an improved bond pad structure.

FIG. 11 provides a flowchart of some embodiments of a method 1100 for manufacturing a 3DIC having an FSI sensor with an improved bond structure. While the disclosed method 1100 and other methods illustrated and/or described herein may be illustrated and/or described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1102, a first substrate is received. The first substrate has photodetectors disposed in the first substrate and has a first interconnect structure disposed on the first substrate.

At 1104, a first mask is formed over first interconnect structure. A first etch is performed with the first mask in place to expose a lower metal layer within the interconnect structure.

At 1106, a bond pad material is formed over the exposed lower metal layer.

At 1108, a second mask is formed over the bond pad material. A second etch is performed with the second mask in place to form a bond pad which is in direct contact with the lower metal layer.

At 1110, a dielectric layer is formed over an upper surface and sidewalls of the bond pad.

At 1112, chemical mechanical planarization (CMP) is performed to planarize the dielectric.

At 1114, a third mask is formed over the planarized dielectric layer. A third etch is performed with the third mask in place to expose an upper surface of the bond pad for bonding.

With reference to FIGS. 12-18, a series of cross-sectional views that collectively illustrate an example manufacturing flow consistent with some example of FIG. 11 is provided. Although FIGS. 12-18 are described in relation to the method, it will be appreciated that the structures disclosed in FIGS. 12-18 are not limited to the method, but instead may stand alone as structures independent of the method. Similarly, although the method is described in relation to FIGS. 12-18, it will be appreciated that the method is not limited to the structures disclosed in FIGS. 6-18, but instead may stand alone independent of the structures disclosed in FIGS. 12-18.

Figure 12:
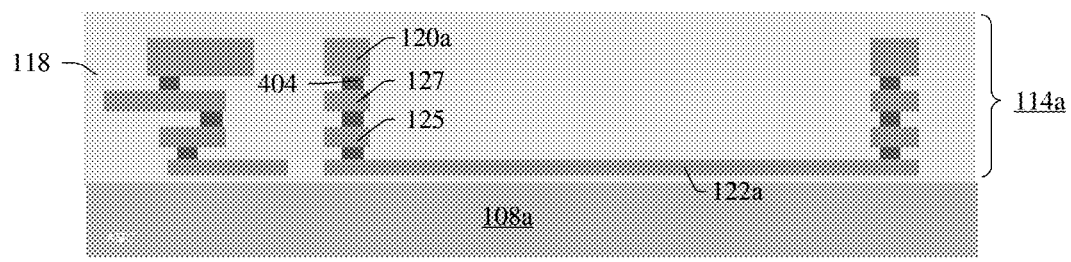
FIGS. 12-18 illustrate a series of cross-sectional views that collectively illustrate an example manufacturing flow consistent with the method of FIG. 11.

FIG. 12 illustrates a cross-sectional view of some embodiments corresponding to Act 1102 of FIG. 11. In FIG. 12 a first substrate 108a is received. The first substrate 108a has photodetectors disposed in the first substrate and has a first interconnect structure 114a disposed on the first substrate. In some embodiments, a first substrate 108a can be a bulk silicon substrate or a semiconductor-on-insulator (SOI) substrate (e.g., silicon on insulator substrate) in the form of a disc-like wafer. The first substrate 108a also be a binary semiconductor substrate (e.g., GaAs), a tertiary semiconductor substrate (e.g., AlGaAs), a higher order semiconductor substrate, or even a sapphire substrate, for example. The first substrate 108a can include doped regions formed in or on the substrate, epitaxial layers formed in or on the substrate, insulating layers formed in or on the substrate, photoresist layers formed in or on the substrate, and/or conducting layers formed in or on the substrate. In many instances, first substrate 108 when in the form of a wafer can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch"); for example.

The interconnect structure 114a includes ILD layers 118 and metal layers 122a, 125, 127, and 120a, respectively, stacked between the ILD layers. The metal layers, which include an upper metal layer 120a with a metal line, are electrically coupled to one another by vias 404. The ILD layer 118 may be, for example, a low κ dielectric or silicon oxide. The metal layers 122a, 125, 127, and 120a, the vias 404 may be, for example, a metal, such as aluminum, copper, or tungsten, or a copper aluminum compound.

Figure 13:
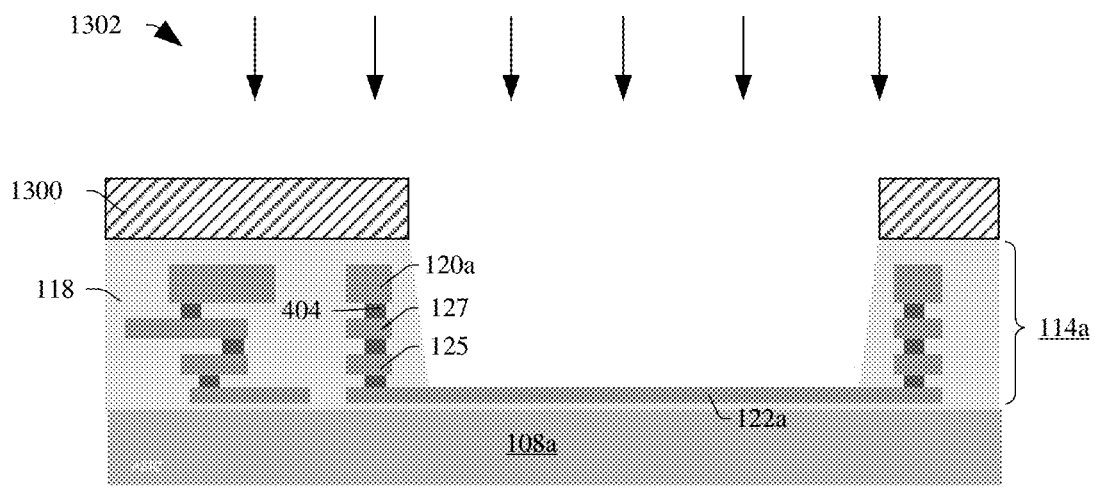

FIG. 13 illustrates a cross-sectional view of some embodiments corresponding to Act 1104 of FIG. 11. As illustrated, a first mask 1300 is formed over first interconnect structure 114a. The first mask 1300 can be a photoresist mask, for example, and/or a hard mask, such as a nitride hardmask. With the first mask 1300 in place, a first etch 1302 is performed to expose a lower metal layer (e.g., 122a) within the interconnect structure 114a. In other embodiments, metal layers 125 or 127 could alternatively be exposed. After the first etch 1302 is performed, the first mask 1300 may be removed.

Figure 14:
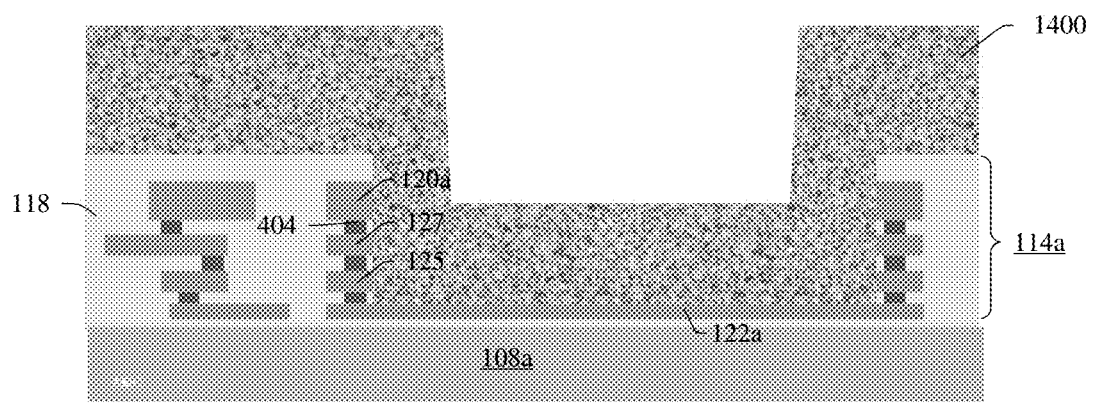

FIG. 14 illustrates a cross-sectional view of some embodiments corresponding to Act 1106 of FIG. 11. In FIG. 14 a bond pad layer 1400 is conformally formed over the exposed lower metal layer 122a and interconnect structure 114a. The bond pad layer 1400 may be formed using vapor deposition (e.g., chemical vapor deposition (CVD) or plasma vapor deposition (PVD), electroplating, sputtering, or any other suitable deposition technique.

Figure 15:
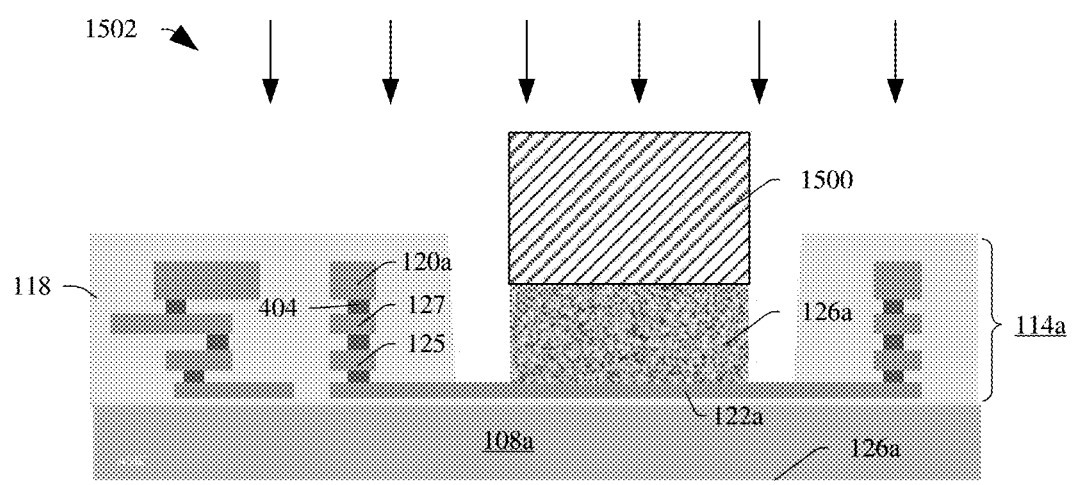

FIG. 15 illustrates a cross-sectional view of some embodiments corresponding to Act 1108 of FIG. 11. In FIG. 15 a second mask 1500 is formed over bond pad layer 1400. The second mask 1500 can be a photoresist mask, for example, and/or a hard mask, such as a nitride hardmask. A second etch 1502 is performed with the second mask 1500 in place to form a bond pad 126a which is in direct contact with the lower metal layer 122a. In FIG. 15's example, the bond pad 126a has outer sidewalls which are spaced apart from inner sidewalls of the interconnect structure. After the second etch 1502, the second mask 1500 may be removed.

Figure 16:
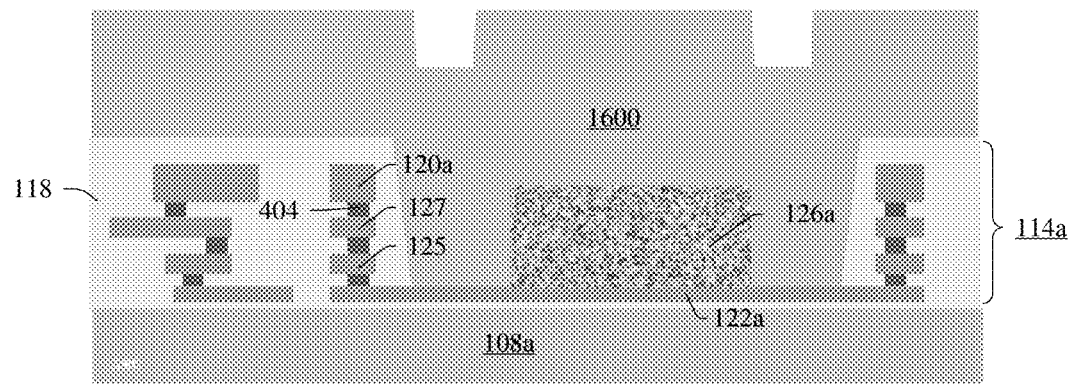

FIG. 16 illustrates a cross-sectional view of some embodiments corresponding to Act 1110 of FIG. 11. In FIG. 16, a dielectric layer 1600 is formed over upper surface and sidewalls of the bond pad. As illustrated, the dielectric layer 1600 fully fills the space between the bond pad and the interconnect structure. The dielectric layer 1600 may be formed, for example, by CVD, PVD, oxidation, spin on techniques, or any other deposition technique.

Figure 17:
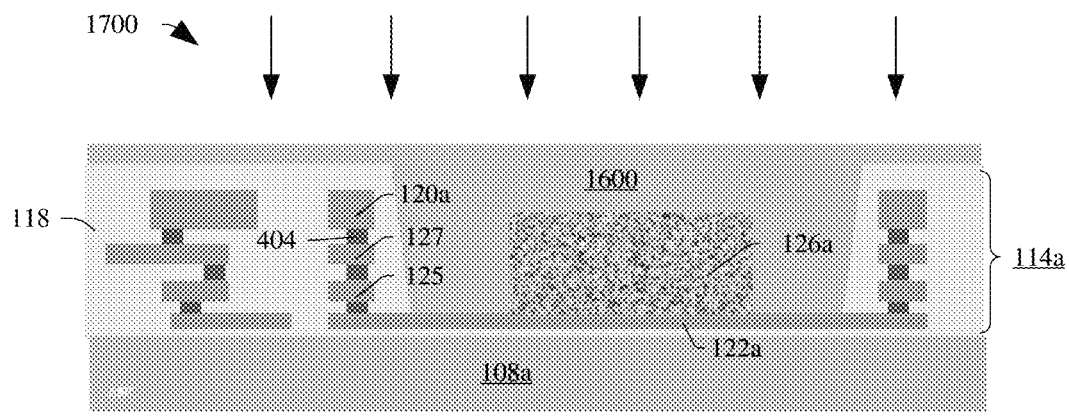

FIG. 17 illustrates a cross-sectional view of some embodiments corresponding to Act 1112 of FIG. 11. In FIG. 17, chemical mechanical planarization (CMP) 1700 is performed to planarize the dielectric layer 1600.

Figure 18:
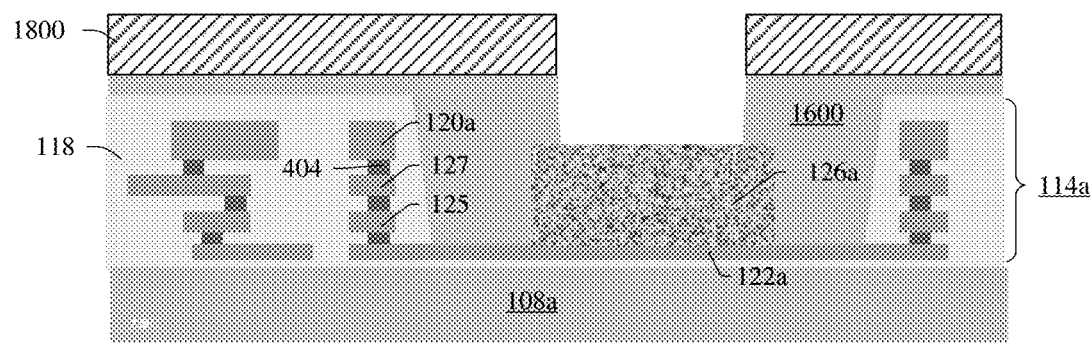

FIG. 18 illustrates a cross-sectional view of some embodiments corresponding to Act 1114 of FIG. 11. In FIG. 18, a third mask 1800 is formed over the planarized dielectric layer 1600. A third etch 1802 performed with the third mask 1800 in place to re-expose an upper surface of the bond pad, and the third mask 1800 is then optionally removed to prepare the resulting bond pad 126a for bonding.

Figure 19:
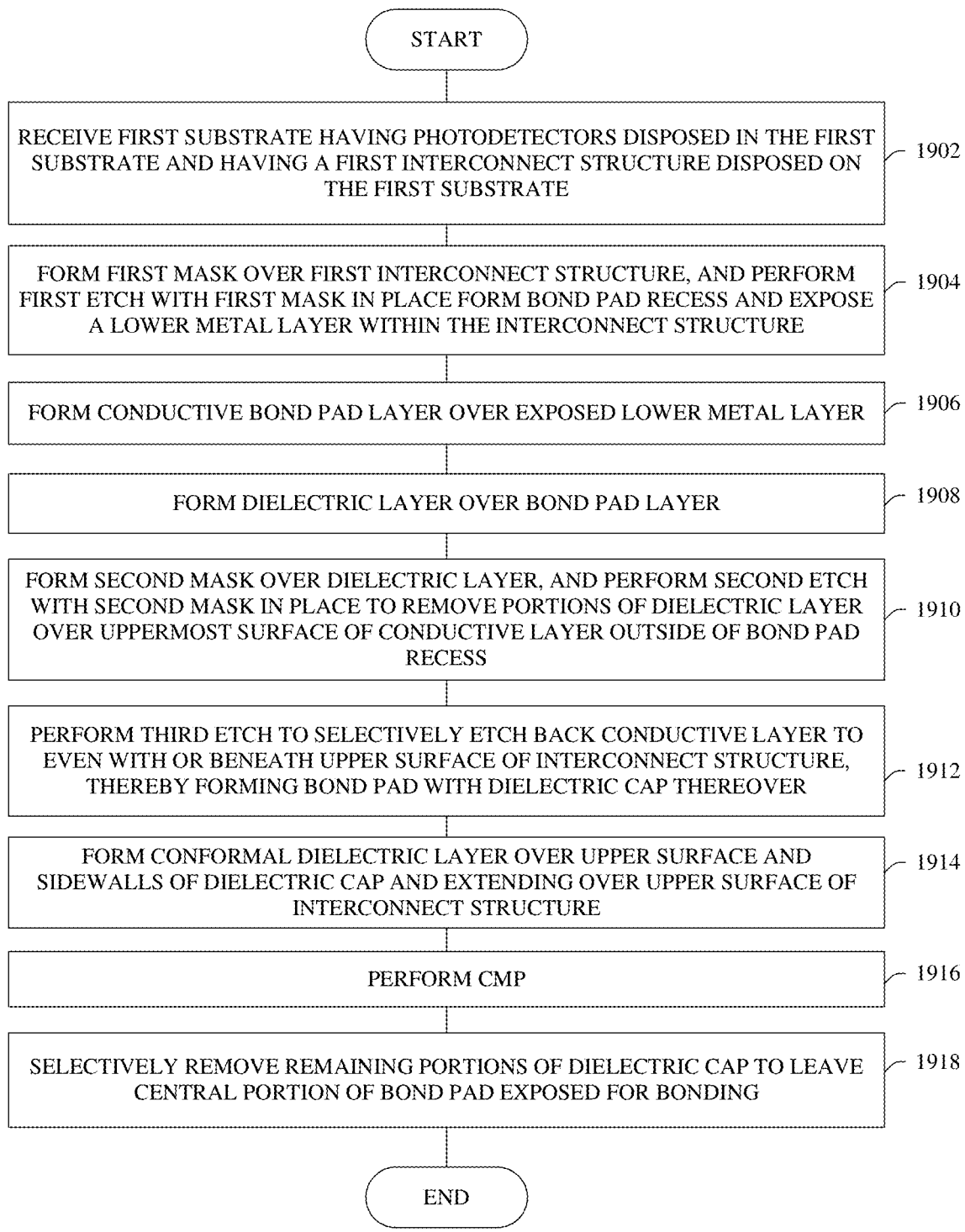
FIG. 19 illustrates a flowchart of some embodiments of a method for manufacturing a 3DIC having a FSI sensor with an improved bond pad structure.

FIG. 19 provides a flowchart of some embodiments of a method 1900 for manufacturing a 3DIC having an FSI sensor with an improved bond structure.

At 1902, a first substrate is received. The first substrate has photodetectors disposed in the first substrate and has a first interconnect structure disposed on the first substrate.

At 1904, a first mask is formed over first interconnect structure. A first etch is performed with the first mask in place to expose a lower metal layer within the interconnect structure.

At 1906, a bond pad layer is formed over the exposed lower metal layer.

At 1908, a dielectric layer is formed over upper surface and sidewalls of the bond pad layer.

At 1910, a second mask is formed over bond pad material. A second etch is performed with the second mask in place to form a bond pad which is in direct contact with the lower metal layer.

At 1912, a third etch is performed to selectively etch back the conductive layer so an upper surface of the etched back conductive layer is even with or below an upper surface of the interconnect structure. In this way, a bond pad is formed with a dielectric cap there over.

At 1914, a conformal dielectric layer is formed over the upper surface and sidewalls of the dielectric cap. The conformal dielectric layer also extends over upper surface of the interconnect layer.

At 1916, CMP is performed to planarize an upper surface of the structure.

At 1918, remaining portions of the dielectric cap are selectively removed to leave a central portion of the bond pad exposed for bonding.

With reference to FIGS. 20-28, a series of cross-sectional views that collectively illustrate an example manufacturing flow consistent with some example of FIG. 19 is provided.

Figure 20:
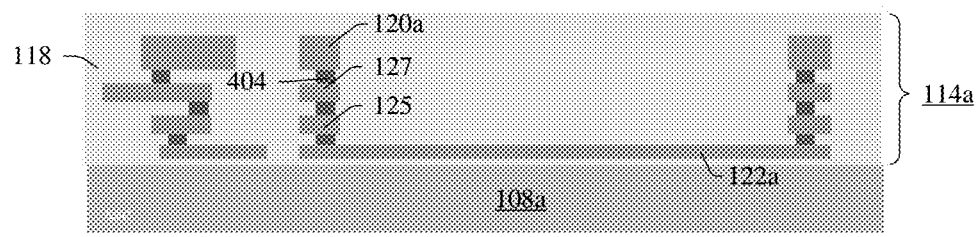

FIG. 20 illustrates a cross-sectional view of some embodiments corresponding to Act 1902 of FIG. 19. In FIG. 20 a first substrate 108a is received. The first substrate 108a can be at least substantially the same as previous described with regards to FIG. 12.

Figure 21:
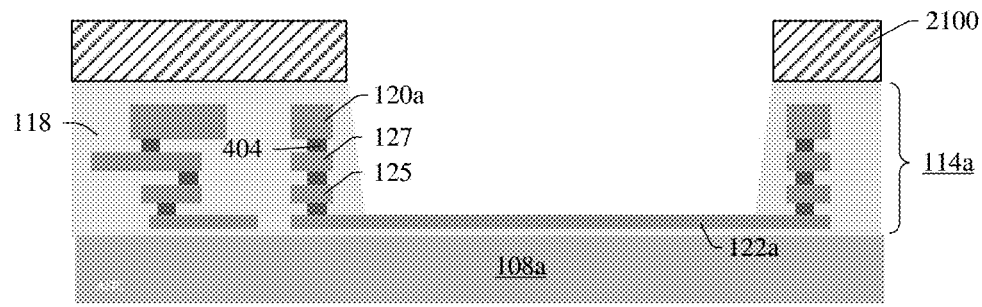

FIG. 21 illustrates a cross-sectional view of some embodiments corresponding to Act 1904 of FIG. 19. As illustrated, a first mask 2100 is formed over first interconnect structure 114a. The first mask 2100 can be a photoresist mask, for example, and/or a hard mask, such as a nitride hardmask. With the first mask 2100 in place, a first etch 2102 is performed to expose a lower metal layer (e.g., 122a) within the interconnect structure 114a. In other embodiments, metal layers 125 or 127 could alternatively be exposed. After the first etch 2102 is performed, the first mask 2100 may be removed.

Figure 22:
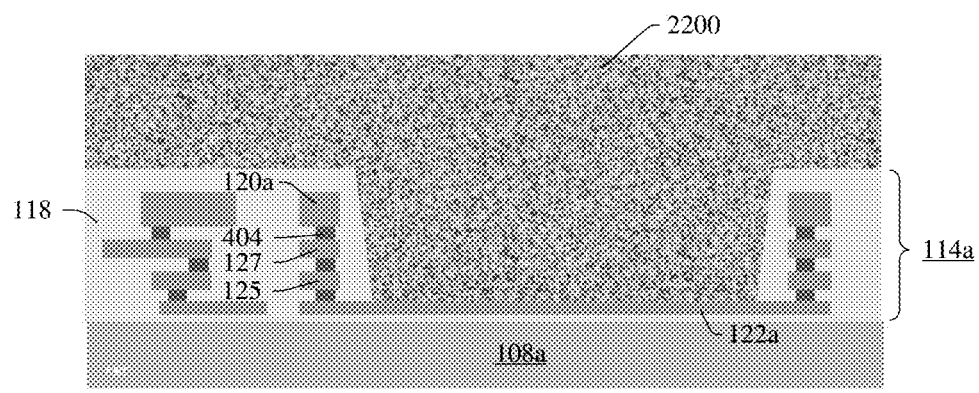

FIG. 22 illustrates a cross-sectional view of some embodiments corresponding to Act 1906 of FIG. 19. In FIG. 22 a bond pad layer 2200 is formed over the exposed lower metal layer 122a and interconnect structure 114a. The bond pad layer can include aluminum or copper, or aluminum copper compounds in some embodiments. The bond pad layer 2200 may be formed using vapor deposition (e.g., chemical vapor deposition (CVD) or plasma vapor deposition (PVD), electroplating, sputtering, or any other suitable deposition technique.

Figure 23:
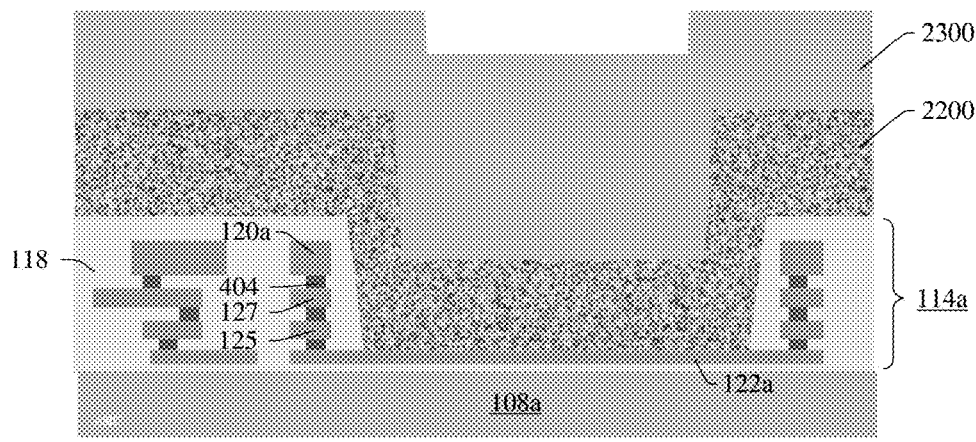

FIG. 23 illustrates a cross-sectional view of some embodiments corresponding to Act 1908 of FIG. 19. In FIG. 23, a dielectric layer 2300 is formed over upper surface and sidewalls of the bond pad layer 2200.

Figure 24:
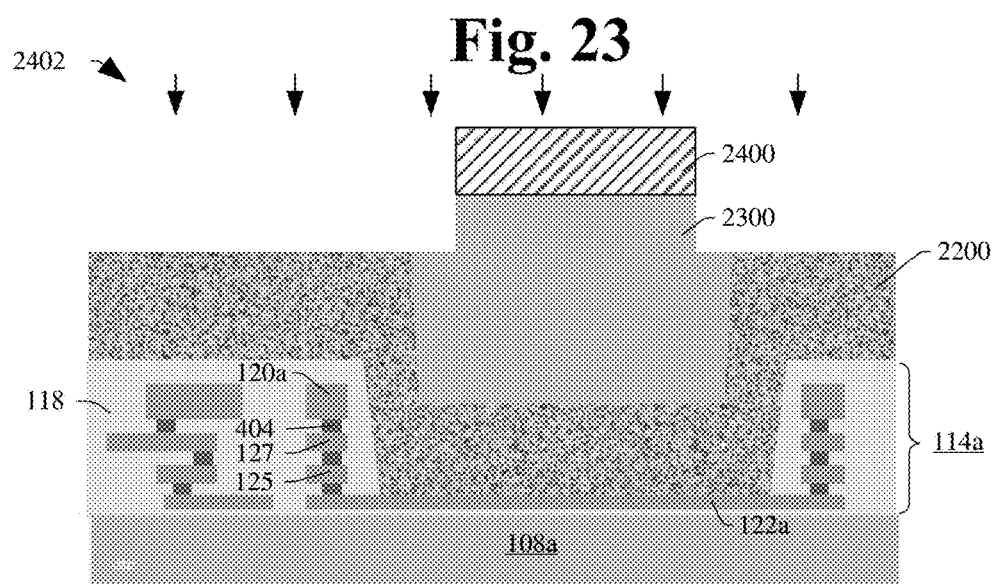

FIG. 24 illustrates a cross-sectional view of some embodiments corresponding to Act 1910 of FIG. 19. In FIG. 24, a second mask 2400 is formed over bond pad material. A second etch 2402 is performed with the second mask in place to remove portions of dielectric layer over uppermost surface of conductive layer outside of the bond pad recess.

Figure 25:
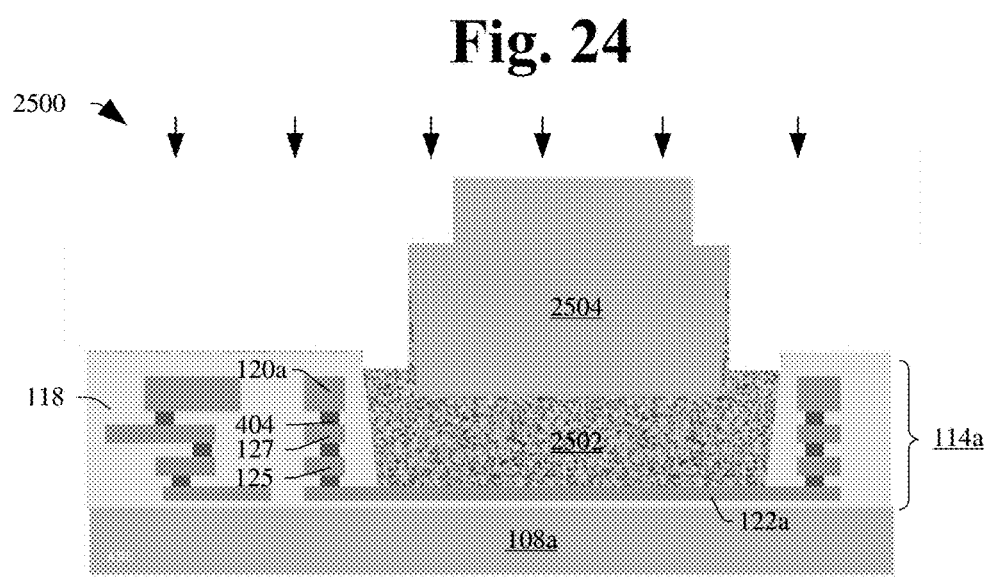

FIG. 25 illustrates a cross-sectional view of some embodiments corresponding to Act 1912 of FIG. 19. In FIG. 25, a third etch 2500 is performed to selectively etch back the conductive layer so an upper surface of the etched back conductive layer is even with or below an upper surface of the interconnect structure. In this way, a bond pad is formed with a dielectric cap 2504 there over.

FIG. 26 illustrates a cross-sectional view of some embodiments corresponding to Act 1914 of FIG. 19. In FIG. 26, a conformal dielectric layer 2600 is formed over the upper surface and sidewalls of the dielectric cap 2504. The conformal dielectric layer 2600 also extends over upper surface of the interconnect layer. The conformal dielectric layer 2600 may be formed, for example, by CVD, PVD, oxidation, spin on techniques, or any other deposition technique.

FIG. 27 illustrates a cross-sectional view of some embodiments corresponding to Act 1916 of FIG. 19. In FIG. 27, CMP is performed to planarize an upper surface of the structure.

FIG. 28 illustrates a cross-sectional view of some embodiments corresponding to Act 1918 of FIG. 19. In FIG. 28, remaining portions of the dielectric cap are selectively removed to leave a central portion of the bond pad 2502 exposed for bonding.

FIG. 28B illustrates another alternative embodiment.

Figure 29:
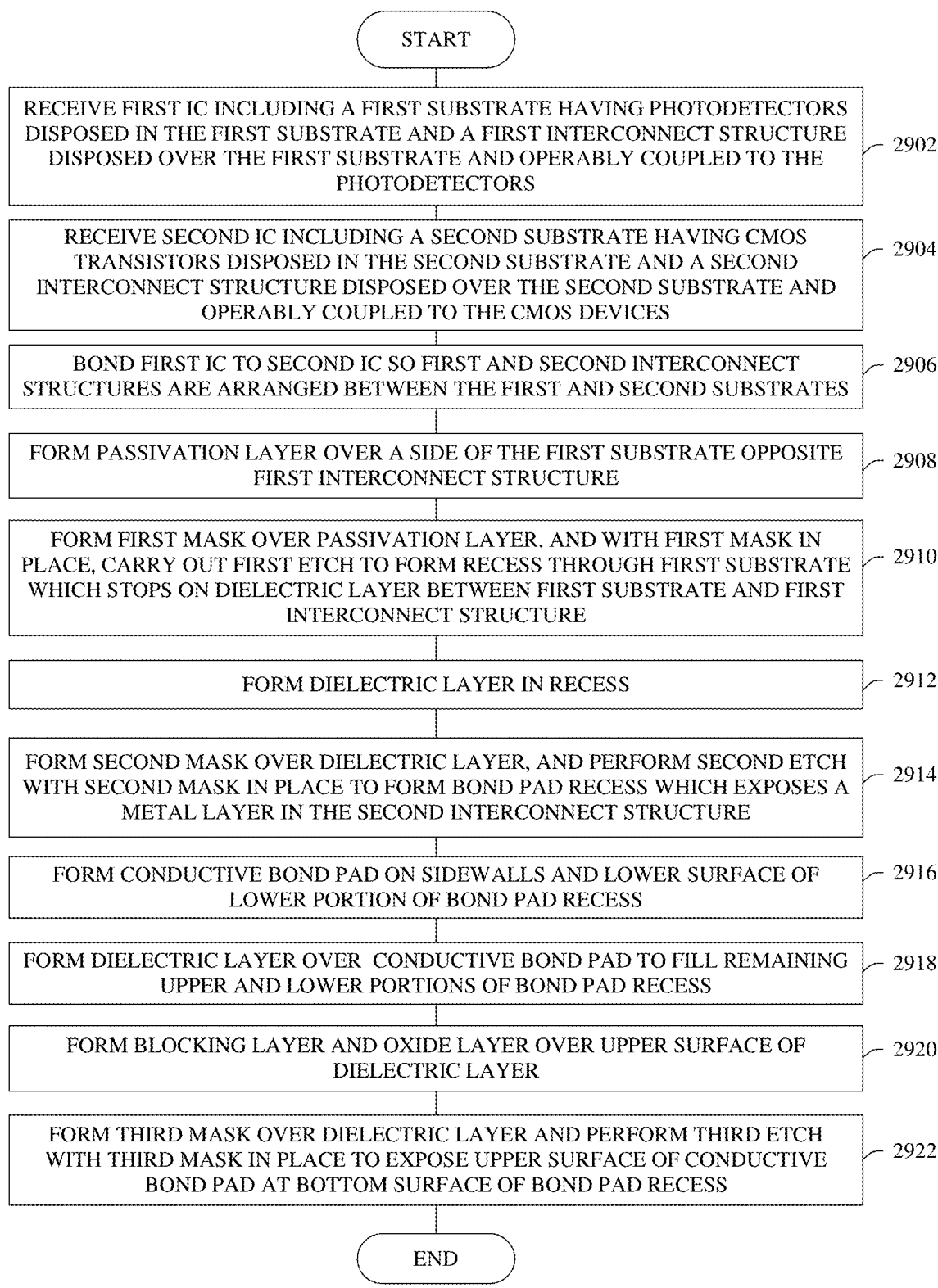
FIG. 29 illustrates a flowchart of some embodiments of a method for manufacturing a 3DIC having a BSI sensor with an improved bond pad structure.

FIG. 29 provides a flowchart of some embodiments of a method 2900 for manufacturing a 3DIC having an FSI sensor with an improved bond structure.

At 2902, a first IC which includes a first substrate is received. The first IC has photodetectors disposed in the first substrate and has a first interconnect structure disposed on the first substrate. The first interconnect structure is operably coupled to the photodetectors.

At 2904, a second IC which includes a second substrate is received. The second IC has CMOS transistors disposed in the second substrate and a second interconnect structure disposed over the second substrate. The second interconnect structure is operably coupled to the CMOS transistors.

At 2906, the first IC is bonded to the second IC so the first and second interconnect structures are arranged adjacent to one another and are arranged between the first and second substrates.

At 2908, a passivation layer is formed over a side of the first substrate opposite first interconnect structure.

At 2910, a first mask is formed over the passivation layer. With the first mask in place, a first etch is carried out to form a recess through the first substrate. The recess stops on a dielectric layer between the first substrate and the first interconnect structure.

At 2912, a dielectric layer is formed in the recess.

At 2914, a second mask is formed over the dielectric layer, and a second etch is performed with second mask in place to form a bond pad recess. The bond pad recess has an upper portion with angled sidewalls spaced apart by a first width and a lower portion with angled sidewalls spaced apart by a second width less than the first width. The bond pad recess exposes a metal layer in the second interconnect structure.

In 2916, a bond pad is formed on sidewalls and a lower surface of the lower portion of the bond pad recess.

In 2918, a dielectric layer is formed over the bond pad to fill remaining upper and lower portions of bond pad recess.

In 2920, a blocking layer and oxide layer are formed over an upper surface of dielectric layer.

In 2922, a third mask is formed over the dielectric layer and a third etch is performed with third mask in place to expose an upper surface of the bond pad at a bottom surface of the bond pad recess.

With reference to FIGS. 30-40, a series of cross-sectional views that collectively illustrate an example manufacturing flow consistent with some example of FIG. 29 is provided.

Figure 30:
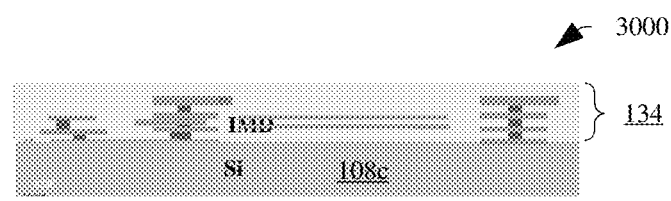
FIGS. 30-40 illustrate a series of cross-sectional views that collectively illustrate an example manufacturing flow consistent with the method of FIG. 29.

FIG. 30 illustrates a cross-sectional view of some embodiments corresponding to Act 2902 of FIG. 29. In FIG. 30, a first IC, which includes a first substrate and a first interconnect layer over the first substrate, is provided. The first substrate include photodetectors and may be at least substantially the same as described with regards to FIG. 12. The first interconnect structure 114a includes ILD layers 118 and metal layers 122a, 125, 127, and 120a, respectively, stacked between the ILD layers. The metal layers, which include an upper metal layer 120a with a metal line, are electrically coupled to one another by vias 404. The ILD layer 118 may be, for example, a low κ dielectric or silicon oxide. The metal layers 122a, 125, 127, and 120a, the vias 404 may be, for example, a metal, such as aluminum, copper, or tungsten, or a copper aluminum compound.

Figure 31:
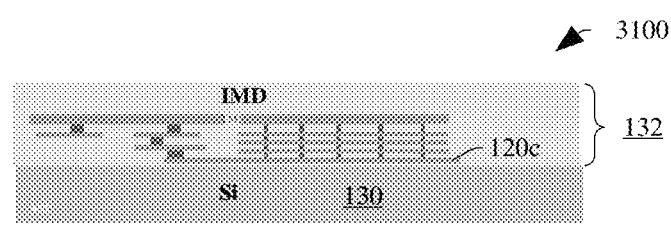

FIG. 31 illustrates a cross-sectional view of some embodiments corresponding to Act 2904 of FIG. 29. In FIG. 31, a second IC, which includes a second substrate and a second interconnect layer over the second substrate, is provided. The second substrate may include CMOS devices and may exhibit an absence of photodetectors or an absence of an array of photodetectors, and may include a bulk silicon substrate, SOI substrate or other substrates as previously described with regards to FIG. 12. The second interconnect structure 114a includes ILD layers 118 and metal layers stacked between the ILD layers. The second interconnect structure can have the same number of metal layers as the first IC or can have a different numbers of metal layers. The metal layers, which include an upper metal layer 120a with a metal line, are electrically coupled to one another by vias 404. Contacts (not shown) couple the lowermost metal layer to device regions, such as gate electrodes or source/drain regions in or proximate to the second substrate. The ILD layer 118 may be, for example, a low κ dielectric or silicon oxide. The metal layers 120a, 122a, 125, 127, and the vias 404 may be, for example, a metal, such as aluminum, copper, or tungsten, or a copper aluminum compound.

Figure 32:
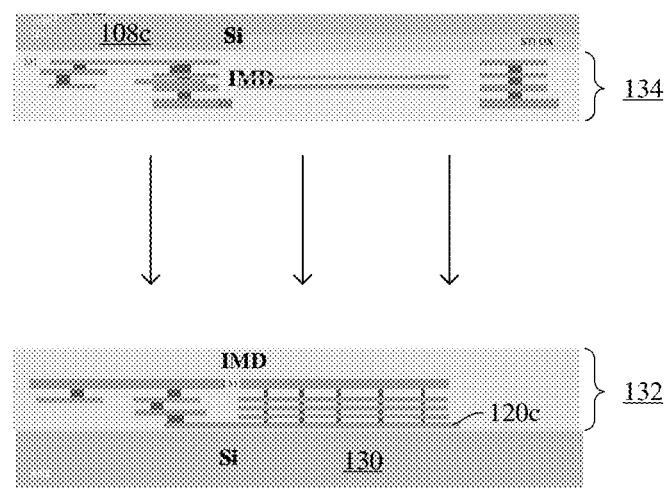

FIG. 32 illustrates a cross-sectional view of some embodiments corresponding to Act 2906 of FIG. 29. In FIG. 32, the first and second ICs are bonded together. Examples of bonding can include, but are not limited to, fusion bonding or eutectic bonding.

Figure 33:
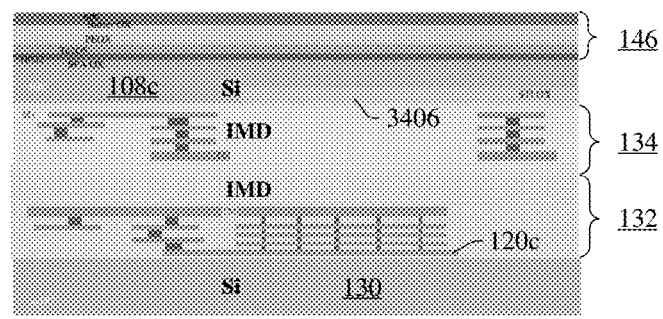

FIG. 33 illustrates a cross-sectional view of some embodiments corresponding to Act 2908 of FIG. 29. In FIG. 33, a passivation layer 146 is formed over a side of the first substrate opposite first interconnect structure. The passivation layer 146 can include a Slot-Plane-Antenna (SPA) radical oxide layer 802, a HfO2 layer 804, a Ta2O5 layer 806, a plasma enhanced oxide layer (PEOx) 808, a silicon nitride (SiN) layer 810, a blocking layer (e.g., Ti, TiN, or W) 812, and an oxide layer 814.

Figure 34:
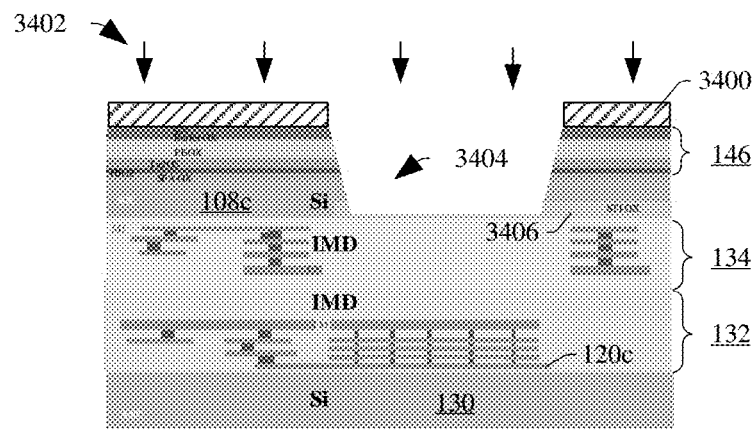

FIG. 34 illustrates a cross-sectional view of some embodiments corresponding to Act 2910 of FIG. 29. In FIG. 34, a first mask 3400 is formed over the passivation layer 146, and a first etch 3402 is carried out with the first mask 3400 in place to form a recess 3404 through the first substrate. The first etch stops on a dielectric layer 3406, such as an oxide layer, separating the first substrate 108c from the first interconnect structure. The first mask 3400 is formed over the passivation layer and can be a photoresist mask, for example, and/or a hard mask, such as a nitride hardmask. In other embodiments, lower metal layers in the second interconnect structure could alternatively be exposed. After the first etch 3402 is performed, the first mask 3400 may be removed.

Figure 35:
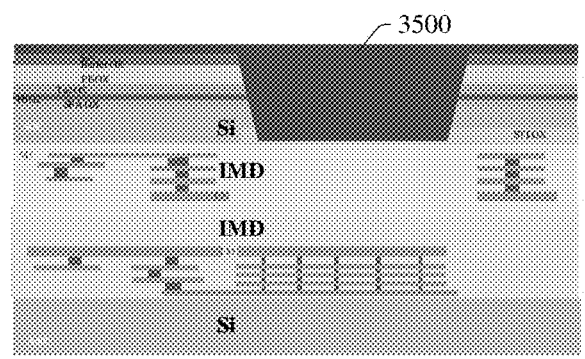

FIG. 35 illustrates a cross-sectional view of some embodiments corresponding to Act 2912 of FIG. 29. In FIG. 35, a dielectric layer 3500 is formed in the recess. The dielectric layer 3500 can be an oxide, such as silicon dioxide for example.

Figure 36:
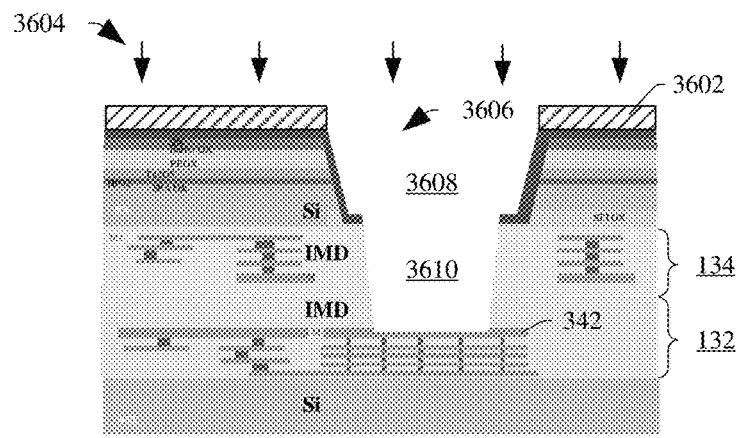

FIG. 36 illustrates a cross-sectional view of some embodiments corresponding to Act 2914 of FIG. 29. In FIG. 36, a second mask 3602 is formed over the dielectric layer, and a second etch 3604 is performed with second mask in place to form a bond pad recess 3606. The bond pad recess has an upper portion 3608 with angled sidewalls spaced apart by a first width and a lower portion 3610 with angled sidewalls spaced apart by a second width less than the first width. The bond pad recess exposes a metal layer 3612 in the second interconnect structure.

Figure 37:
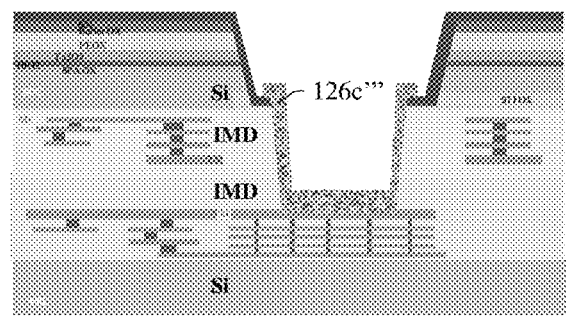

FIG. 37 illustrates a cross-sectional view of some embodiments corresponding to Act 2916 of FIG. 29. In FIG. 37, a bond pad 126c' is formed on sidewalls and a lower surface of the lower portion of bond pad recess. The bond pad 126'can be formed by forming a conformal conductive layer, such as copper, aluminum, or a copper aluminum compound, on sidewalls and a lower surface of the bond pad recess; forming a mask such as a photoresist mask over the bottom portion of the conductive layer; and then performing an etch to remove selected portions of the conductive layer to leave bond pad in the lower portion of the bond pad recess.

Figure 38:
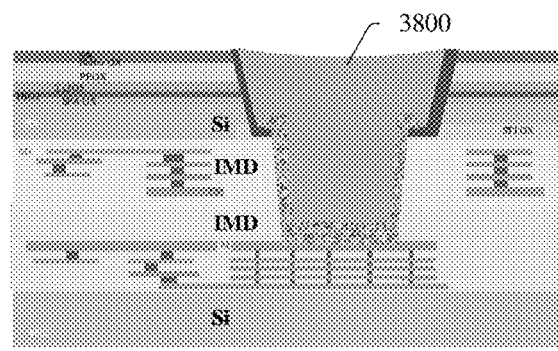

FIG. 38 illustrates a cross-sectional view of some embodiments corresponding to Act 2918 of FIG. 29. In FIG. 38, a dielectric layer 3800 is formed over the bond pad to fill remaining upper and lower portions of bond pad recess. The dielectric layer 3800 can be an oxide, such as silicon dioxide for example.

Figure 39:
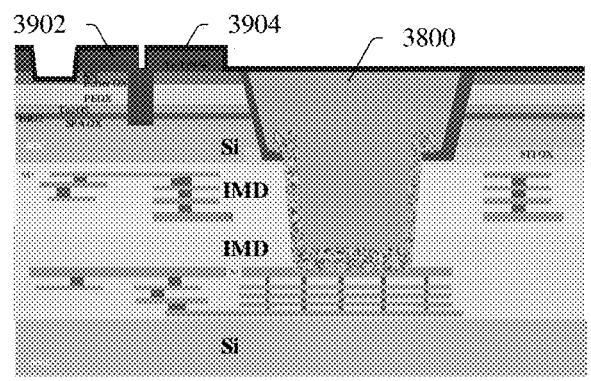

FIG. 39 illustrates a cross-sectional view of some embodiments corresponding to Act 2920 of FIG. 29. In FIG. 39, a blocking layer 3902 and oxide layer 3904 are formed over an upper surface of dielectric layer 3800. The blocking layer 3902 can be a metal, such as Ti, TiN, or W for example; and the oxide layer 3904 can be silicon dioxide for example.

Figure 40:
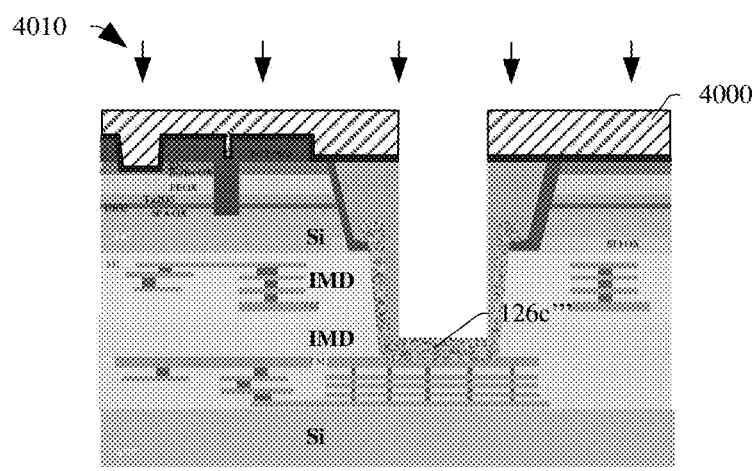

FIG. 40 illustrates a cross-sectional view of some embodiments corresponding to Act 2922 of FIG. 29. In FIG. 40, a third mask 4000 is formed over the dielectric layer and a third etch 4010 is performed with third mask in place to expose upper surface of bond pad 126''' on a bottom surface of the bond pad recess. Thus, the bond pad 126'' is now exposed so a conductive bond, such as a solder ball or other conductive lead, can be coupled to the bond pad 126''' during assembly.

Figure 41:
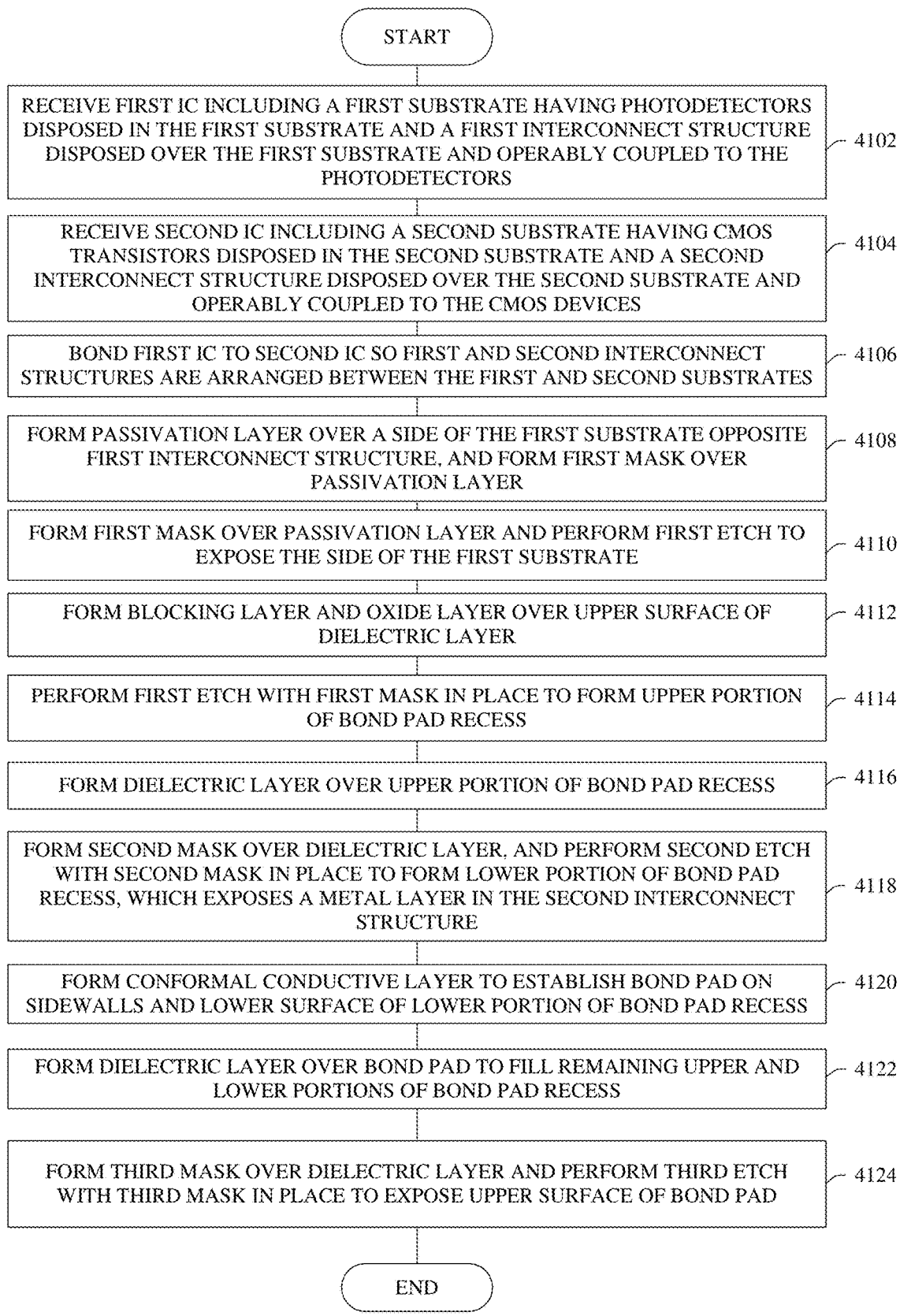
FIG. 41 illustrates a flowchart of some embodiments of a method for manufacturing a 3DIC having a FSI sensor with an improved bond pad structure.

FIG. 41 provides a flowchart of some embodiments of a method 4100 for manufacturing a 3DIC having an FSI sensor with an improved bond structure.

At 4102, a first IC which includes a first substrate is received. The first IC has photodetectors disposed in the first substrate and has a first interconnect structure disposed on the first substrate. The first interconnect structure is operably coupled to the photodetectors.

At 4104, a second IC which includes a second substrate is received. The second IC has CMOS transistors disposed in the second substrate and a second interconnect structure disposed over the second substrate. The second interconnect structure is operably coupled to the CMOS transistors.

At 4106, the first IC is bonded to the second IC so the first and second interconnect structures are arranged adjacent to one another and are arranged between the first and second substrates.

At 4108, a passivation layer is formed over a side of the first substrate opposite first interconnect structure.

At 4110, a first mask is formed over the passivation layer. With the first mask in place, a first etch is carried out expose the side of the first substrate.

At 4112, a blocking layer and oxide layer are formed over upper surface of dielectric layer.

At 4114, a second mask is formed, and a second etch is performed with the second mask in place to form an upper portion of bond pad recess.

In 4116, a dielectric layer is formed over the upper portion of bond pad recess.

In 4118, a third mask is formed over the dielectric layer, and a third etch is performed with the third mask in place to form a lower portion of a bond pad recess. The lower portion of the bond pad recess exposes a metal layer in the second interconnect structure.

In 4120, a conformal conductive layer is formed on sidewalls and lower surface of the lower portion of bond pad recess.

In 4122, a dielectric layer is formed over the conformal conductive layer to fill remaining upper and lower portions of bond pad recess.

In 4124, a fourth mask is formed over the dielectric layer, and a fourth etch is performed with the fourth mask in place to expose an upper surface of the bond pad.

With reference to FIGS. 42-50, a series of cross-sectional views that collectively illustrate an example manufacturing flow consistent with some example of FIG. 41 is provided.

Figure 42:
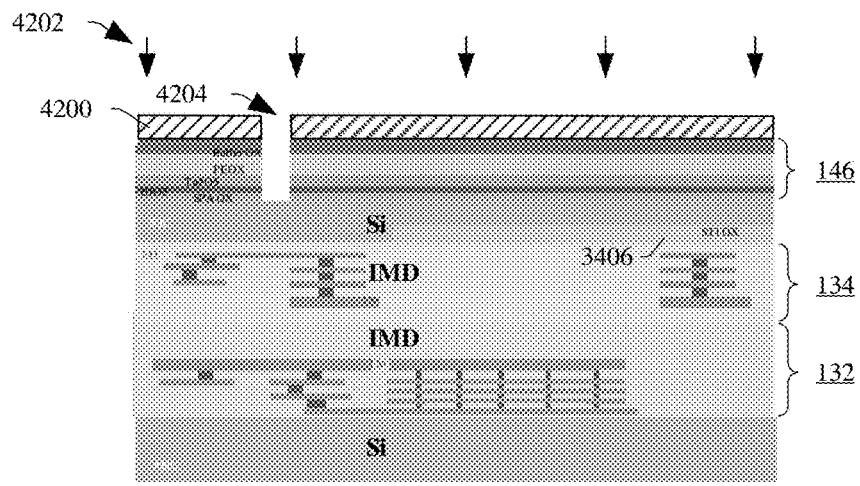
FIGS. 42-49 illustrate a series of cross-sectional views that collectively illustrate an example manufacturing flow consistent with the method of FIG. 41.

FIG. 42 illustrates a cross-sectional view of some embodiments corresponding to Act 4108 of FIG. 41. Prior to FIG. 42, first and second ICs have been bonded together and a passivation layer has been formed there over, such as previously described with regards to FIGS. 30-33. In FIG. 42, a first mask 4200 is formed over the passivation layer 146, and a first etch 4202 is carried out with the first mask 4200 in place to form a recess 4204 through the first substrate. The first etch 4202 stops on a dielectric layer 3406, such as an oxide layer, separating the first substrate 108c from the first interconnect structure. The first mask 4200 is formed over the passivation layer and can be a photoresist mask, for example, and/or a hard mask, such as a nitride hardmask. In other embodiments, lower metal layers in the second interconnect structure could alternatively be exposed. After the first etch 4202 is performed, the first mask 4200 may be removed.

Figure 43:
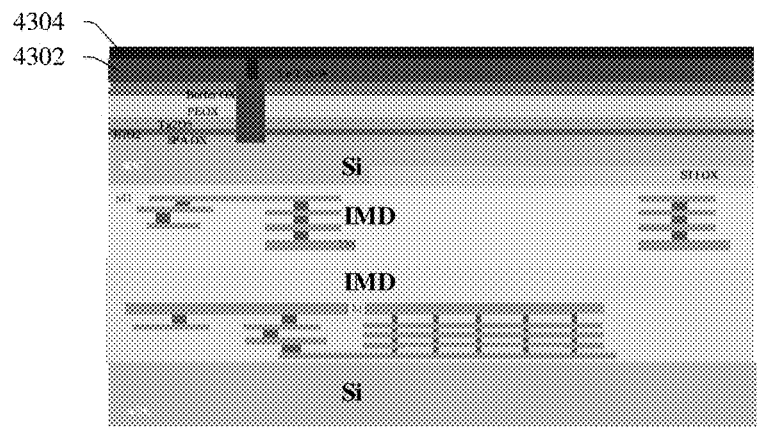

FIG. 43 illustrates a cross-sectional view of some embodiments corresponding to Act 4112 of FIG. 41. In FIG. 43, a blocking layer 4302 and oxide layer 4304 are formed over upper surface of dielectric layer.

Figure 44:
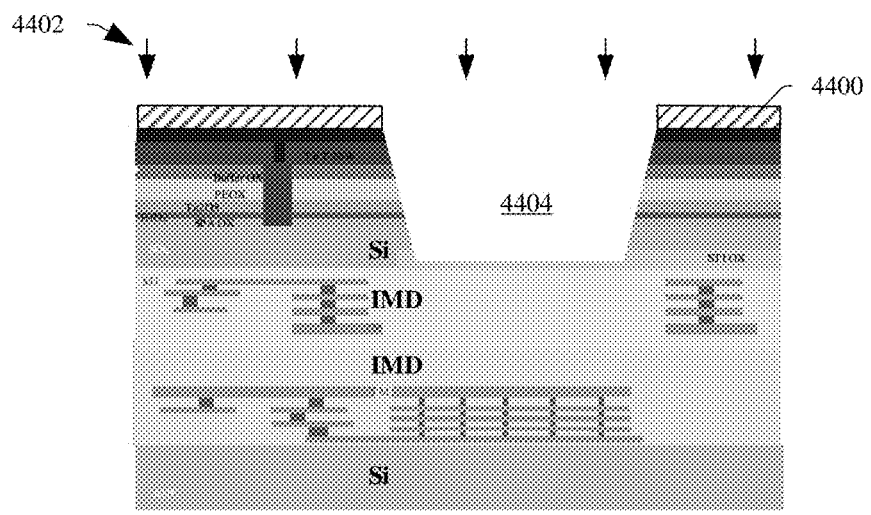

FIG. 44 illustrates a cross-sectional view of some embodiments corresponding to Act 4114 of FIG. 41. In FIG. 44, a second mask 4400 is formed, and a second etch 4402 is performed with the second mask 4400 in place to form an upper portion of bond pad recess 4404.

Figure 45:
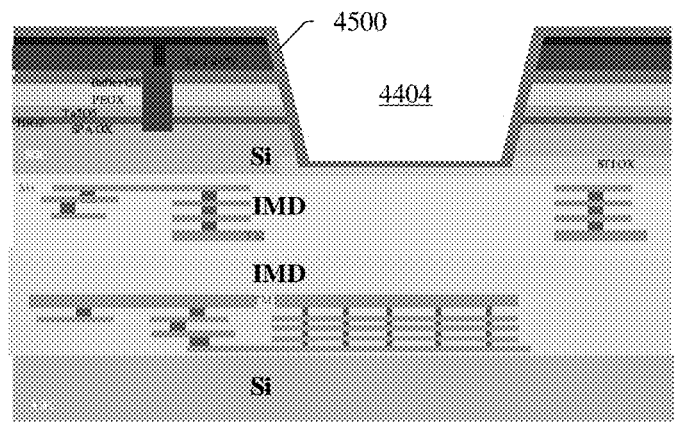
Figure 46:
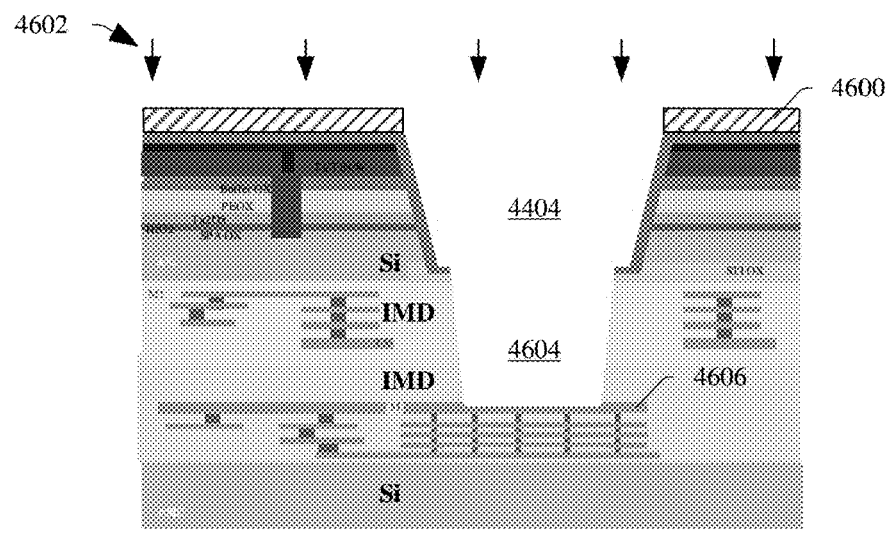

FIG. 45 illustrates a cross-sectional view of some embodiments corresponding to Act 4116 of FIG. 41. In FIG. 45, a dielectric layer 4500 is formed over the upper portion of bond pad recess FIG. 46 illustrates a cross-sectional view of some embodiments corresponding to Act 4118 of FIG. 41. In FIG. 46, a second mask 4600 is formed over the dielectric layer, and a second etch 4602 is performed with the second mask 4600 in place to form a lower portion of a bond pad recess 4604. The lower portion of the bond pad recess 4604 exposes a metal layer 4606 in the second interconnect structure.

Figure 47:
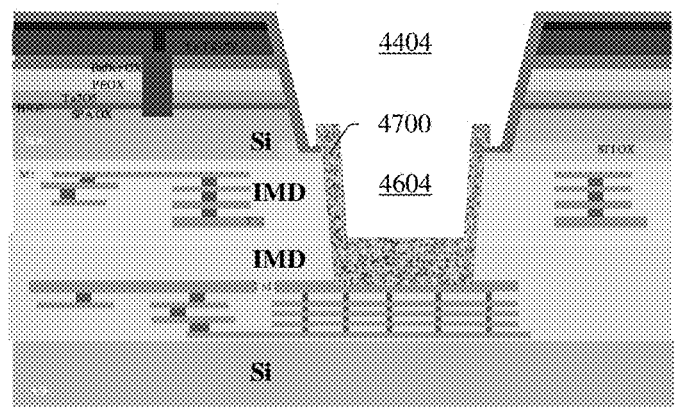

FIG. 47 illustrates a cross-sectional view of some embodiments corresponding to Act 4120 of FIG. 41. In FIG. 47, a bond pad 4700 is formed on sidewalls and lower surface of the lower portion of bond pad recess. The bond pad 4700 can be formed by forming a conformal conductive layer, such as copper, aluminum, or a copper aluminum compound, on sidewalls and a lower surface of the bond pad recess; forming a mask such as a photoresist mask over the bottom portion of the conductive layer; and then performing an etch to remove selected portions of the conductive layer to leave bond pad in the lower portion of the bond pad recess.

Figure 48:
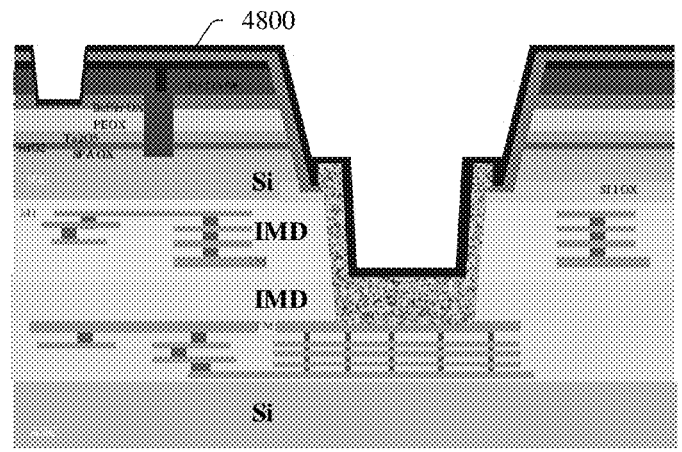

FIG. 48 illustrates a cross-sectional view of some embodiments corresponding to Act 4122 of FIG. 41. In FIG. 48, a dielectric layer 4800 is formed over the conformal conductive layer to fill remaining upper and lower portions of bond pad recess.

Figure 49:
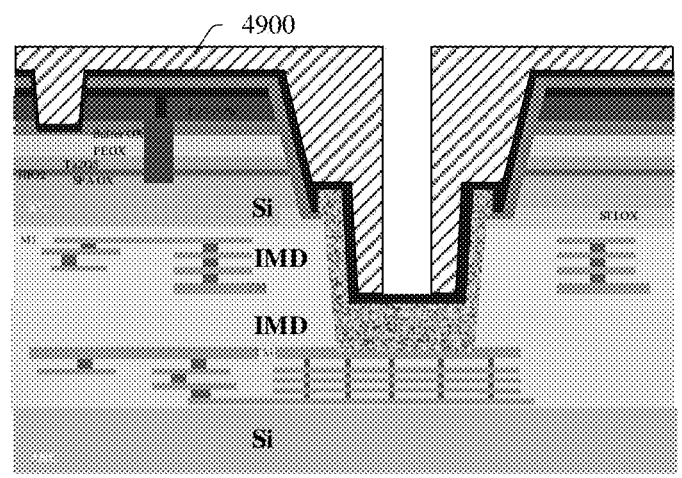

FIG. 49 illustrates a cross-sectional view of some embodiments corresponding to Act 4124 of FIG. 41. In FIG. 49, a third mask 4900 is formed over the dielectric layer, and a third etch is performed with the third mask in place to expose an upper surface of the bond pad.

Thus, as can be appreciated from above, the present disclosure provides a three-dimensional (3D) integrated circuit (IC). The 3DIC includes a first substrate including a photodetector which is configured to receive light in a first direction from a light source. An interconnect structure is disposed over the first substrate, and includes a plurality of metal layers and insulating layers that are over stacked over one another in alternating fashion. One of the plurality of metal layers is closest to the light source and another of the plurality of metal layers is furthest from the light source. A bond pad recess extends into the interconnect structure from an opening in a surface of the 3DIC which is nearest the light source and terminates at a bond pad. The bond pad is spaced apart from the surface of the 3DIC and is in direct contact with the one of the plurality of metal layers that is furthest from the light source.

In other embodiments, the present disclosure provides a frontside illumination (FSI) sensor. The FSI sensor includes an image sensor substrate having a first surface configured to receive illumination and a second surface opposite the first surface. An array of photodetectors is arranged in the image sensor substrate between the first and second surfaces. An image sensor interconnect structure abuts the second surface. The image sensor interconnect structure includes a plurality of metal layers and insulating layers that are stacked over one another in alternating fashion. A first metal layer of the plurality of metal layers is spaced at a first vertical distance from the second surface. The first distance is less than other respective vertical distances from the other respective metal layers to the second surface. A bond pad structure is laterally spaced from the array of photodetectors and includes a bond pad recess extending from an upper surface of the image sensor interconnect and terminating at a bond pad which is in direct contact with the first metal layer.

Other embodiments relate to a backside illumination (BSI) sensor. The BSI sensor includes an image sensor substrate having a first surface configured to receive illumination and a second surface opposite the first surface. An array of photodetectors is arranged the image sensor substrate between the first and second surfaces. An image sensor interconnect structure abuts the second surface, and includes a plurality of metal layers and insulating layers that over stacked over one another in alternating fashion. A CMOS interconnect structure is arranged over the image sensor interconnect structure, and includes a plurality of metal layers and insulating layers that over stacked over one another in alternating fashion. A CMOS substrate is disposed over the CMOS interconnect structure and includes a plurality of CMOS devices which are interconnected by the CMOS interconnect structure. A bond pad structure is laterally spaced from the array of photodetectors and includes a bond pad recess extending from the first surface of the image sensor substrate through the image sensor substrate, through the image sensor interconnect structure, and terminating at a bond pad which is disposed within the CMOS interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
a first substrate including a plurality of imaging devices;
a second substrate disposed under the first substrate and including a plurality of logic devices;
a first interconnect structure disposed between the first substrate and the second substrate and configured to electrically couple imaging devices within the first substrate to one another;
a second interconnect structure disposed between the first interconnect structure and the second substrate, the second interconnect structure configured to electrically couple logic devices within the second substrate to one another;
a bond pad structure coupled to a metal layer of the second interconnect structure and extending along inner sidewalls of both the first interconnect structure and the second interconnect structure; and
an oxide layer extending from above the first substrate to below a plurality of metal layers of the first interconnect structure, and lining inner sidewalls of the bond pad structure.

2. The IC of claim 1, wherein a bond pad opening extends through the first substrate, through the first interconnect structure, and into the second interconnect structure, wherein the bond pad structure is disposed in the bond pad opening and directly contacts the metal layer of the second interconnect structure.

3. The IC of claim 1, wherein the metal layer of the second interconnect structure is an uppermost metal layer of the second interconnect structure.

4. The IC of claim 1, wherein the first interconnect structure is arranged between a light source and the first substrate, such that light from the light source passes through the first interconnect structure before being received by the plurality of imaging devices.

5. The IC of claim 1, wherein the first substrate is arranged between a light source and the first interconnect structure, such that light from the light source is received by the plurality of imaging devices without previously passing through the first interconnect structure.

6. The IC of claim 1,
wherein the first interconnect structure comprises: a first lowermost metal layer spaced at a first distance from a first surface of the first substrate; and a first uppermost metal layer spaced at a second distance from the first surface of the first substrate, the second distance being less than the first distance;
wherein the second interconnect structure comprises: a second lowermost metal layer spaced at a third distance from a first surface of the second substrate; and a second uppermost metal layer spaced at a fourth distance from the first surface of the second substrate, the fourth distance being greater than the third distance, wherein the second uppermost metal layer is nearer to the first lowermost metal layer than to the first uppermost metal layer; and
wherein a bond pad opening extends through the first substrate, through the first interconnect structure, and past the second uppermost metal layer, and wherein the bond pad is in direct contact with the second lowermost metal layer.

7. An integrated circuit (IC), comprising:
a first substrate;
an interconnect structure under the first substrate, wherein the interconnect structure comprises a plurality of metal layers; and
a bond pad recess extending through the first substrate and into the interconnect structure and terminating at a bond pad, wherein the bond pad comprises a base portion and an upper portion, wherein a bottom surface of the base portion of the bond pad directly contacts a topmost surface of a metal layer of the interconnect structure, wherein a lower surface of the upper portion of the bond pad is level with a lower surface of an oxide layer defining the bond pad recess.

8. The IC of claim 7:
wherein the interconnect structure further comprises a top surface, a bottom surface, and a center plane equidistant from the top surface and the bottom surface, and
wherein the topmost surface of the metal layer is closer to the center plane of the interconnect structure than to the top surface and bottom surface of the interconnect structure.

9. The IC of claim 7, further comprising:
a second substrate under the interconnect structure;
wherein the metal layers are stacked over one another and embedded within a dielectric layer between the first substrate and the second substrate, wherein the plurality of metal layers includes all metal layers in the dielectric layer, wherein the metal layer is a lowermost metal layer of the plurality of metal layers and is closest to the second substrate.

10. The IC of claim 9, wherein no additional metal layers reside between the metal layer and the second substrate.

11. The IC of claim 7, wherein the first substrate includes a plurality of photodetectors and wherein the interconnect structure is arranged between a light source and the first substrate, such that light from the light source passes through the interconnect structure before being received by the plurality of photodetectors.

12. The IC of claim 7, wherein the first substrate includes a plurality of photodetectors and is arranged between a light source and the interconnect structure, such that light from the light source is received by the plurality of photodetectors without previously passing through the interconnect structure.

13. The IC of claim 7, wherein the bond pad recess has sidewalls that are angled at an angle of other than 90 degrees relative to an upper surface of the first substrate.

14. The IC of claim 7, wherein the base portion and upper portion of the bond pad collectively have a generally U-shaped cross-section.

15. An integrated circuit (IC), comprising:
a first substrate;
an interconnect structure contacting a bottom face of the first substrate, wherein the interconnect structure comprises a plurality of metal layers;
a bond pad recess extending into a topmost surface of and toward a bottommost surface of the interconnect structure, the bond pad recess being defined by an oxide layer including multiple sets of inner sidewalls, wherein at least one of the multiple sets of inner sidewalls are vertical and disposed beneath a horizontal surface of the oxide layer within the bond pad recess; and
a bond pad exposed to the bond pad recess and in direct contact with a first metal layer of the plurality of metal layers.

16. The IC of claim 15, further comprising:
a multi-layer passivation structure disposed over a top face of the first substrate, wherein the bond pad recess extends through the multi-layer passivation structure.

17. The IC of claim 16, wherein the oxide layer includes an upper portion lining inner sidewalls of the multi-layer passivation structure, and a lower portion lining inner sidewalls of the bond pad and terminating on an upper surface of the bond pad.

18. The IC of claim 17, wherein inner sidewalls of the upper portion of the oxide layer are spaced apart by a first distance, and inner sidewalls of the lower portion of the oxide layer are spaced apart by a second distance less than the first distance.

19. The IC of claim 18, wherein the inner sidewalls of the upper portion of the oxide layer and the inner sidewalls of the lower portion of the oxide layer are joined by the horizontal surface.

20. The IC of claim 17, wherein the inner sidewalls of the lower portion are perpendicular with regards to the bottom face of the first substrate, and the inner sidewalls of the upper portion are non-perpendicular with regards to the bottom face of the first substrate.

* * * * *